United States Patent
Itagaki

(10) Patent No.: US 9,842,877 B2
(45) Date of Patent: Dec. 12, 2017

(54) SEMICONDUCTOR DEVICE AND MANUFACTURING METHOD THEREOF

(71) Applicant: RENESAS ELECTRONICS CORPORATION, Kanagawa (JP)

(72) Inventor: Keiichi Itagaki, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/553,697

(22) Filed: Nov. 25, 2014

(65) Prior Publication Data
US 2015/0145092 A1 May 28, 2015

(30) Foreign Application Priority Data
Nov. 27, 2013 (JP) .................................. 2013-244817

(51) Int. Cl.
*H01L 31/00* (2006.01)
*H01L 27/146* (2006.01)

(52) U.S. Cl.
CPC .... *H01L 27/1463* (2013.01); *H01L 27/14612* (2013.01); *H01L 27/14643* (2013.01); *H01L 27/14687* (2013.01); *H01L 27/14689* (2013.01); *H01L 27/14627* (2013.01)

(58) Field of Classification Search
CPC ........... H01L 27/1463; H01L 27/14643; H01L 27/14612
See application file for complete search history.

(56) References Cited

U.S. PATENT DOCUMENTS 6,030,863 A * 2/2000 Chang ................. H01L 21/2236
257/E21.143
7,187,023 B2 3/2007 Yoshihara
(Continued)

FOREIGN PATENT DOCUMENTS

JP 2005-347325 A 12/2005
JP 2012-28380 A 2/2012
(Continued)

OTHER PUBLICATIONS

Japanese Notification of Reasons for Refusal dated May 23, 2017, issued in Japanese Patent Application No. 2013-244817. (w/ English translation).

*Primary Examiner* — Dale E Page
*Assistant Examiner* — Wasiul Haider
(74) *Attorney, Agent, or Firm* — McDermott Will & Emery LLP

(57) ABSTRACT

A semiconductor device includes a semiconductor substrate, a photoelectric conversion element, a first isolation insulating film, and a current blocking region. The first isolation insulating film is formed around the photoelectric conversion element. The current blocking region is formed in a region between the photoelectric conversion element and the first isolation insulating film. The current blocking region includes an impurity diffusion layer, and a defect extension preventing layer disposed in contact with the impurity diffusion layer to form a twin with the impurity diffusion layer. The defect extension preventing layer has a different crystal structure from that of the impurity diffusion layer. At least a part of the current blocking region is disposed in contact with the first isolation insulating film.

8 Claims, 36 Drawing Sheets

(56) References Cited

U.S. PATENT DOCUMENTS

| | | | |
|---|---|---|---|
| 7,592,655 B2* | 9/2009 | Ohkawa | H01L 21/76897 |
| | | | 257/291 |
| 8,815,634 B2 | 8/2014 | Ramappa et al. | |
| 2006/0228897 A1* | 10/2006 | Timans | H01L 21/67115 |
| | | | 438/758 |
| 2007/0020795 A1 | 1/2007 | Mori et al. | |
| 2008/0251821 A1* | 10/2008 | Ko | H01L 27/14609 |
| | | | 257/292 |
| 2010/0224917 A1* | 9/2010 | Yamaguchi | H01L 27/14603 |
| | | | 257/290 |
| 2011/0242390 A1* | 10/2011 | Sogoh | H01L 27/14609 |
| | | | 348/311 |
| 2011/0303999 A1* | 12/2011 | Sakamoto | H01L 27/1446 |
| | | | 257/432 |

FOREIGN PATENT DOCUMENTS

| | | |
|---|---|---|
| JP | 2012-507871 A | 3/2012 |
| WO | 2005/069377 A1 | 7/2005 |

* cited by examiner

SEMICONDUCTOR DEVICE AND MANUFACTURING METHOD THEREOF

CROSS-REFERENCE TO RELATED APPLICATIONS

The disclosure of Japanese Patent Application No. 2013-244817 filed on Nov. 27, 2013 including the specification, drawings and abstract is incorporated herein by reference in its entirety.

BACKGROUND

The present invention relates to semiconductor devices and manufacturing methods thereof, and more particularly, to a semiconductor device including a photoelectric conversion element, such as a photodiode, and a manufacturing method thereof.

A semiconductor device (solid-state image sensing element) for an image sensor has a plurality of photoelectric conversion elements, such as photodiodes, formed over a semiconductor substrate with a spacing therebetween. In order to suppress a leak current flowing between a pair of adjacent photodiodes, the semiconductor device has an isolation insulating film for element isolation formed between the pair of photodiodes. When forming the isolation insulating film, a number of damage layers are formed. Via the damage layer, a fine leak current called dark current might flow between the pair of adjacent photodiodes in some cases. The leak current becomes noise to the solid-state image sensing element, which reduces the performance of the solid-state image sensing element. To suppress this phenomenon, a current blocking region called a guard ring is provided in the vicinity of the isolation insulating film.

The structure with the guard ring in contact with the isolation insulating film is disclosed, for example, in Japanese Unexamined Patent Application Publication No. 2012-28380 (Patent Document 1).

RELATED ART DOCUMENTS

Patent Documents

[Patent Document 1]
Japanese Unexamined Patent Application Publication No. 2012-28380

SUMMARY

A guard ring is formed, for example, by forming an impurity diffusion layer in a semiconductor substrate by ion implantation. Specifically, by increasing the concentration of impurities to be ion-implanted, the guard ring comprised of the impurity diffusion layer with a high concentration is formed to enhance the effect of suppressing the leak current. However, the guard ring formed by the ion implantation at high intensity tends to have crystal defects. The crystal defects can induce a defective pixel of a photodiode. In contrast, by decreasing the concentration of impurities in the guard ring, the possibility of occurrence of defective pixels due to the crystal defects is reduced, while weakening the effect that the guard ring might suppress the leak current. In this way, there is a tradeoff between the measures against the crystal defect and the measures against the leak current in the guard ring. It is difficult to enhance both effects. Patent Document 1 fails to disclose any measures against the above-mentioned problems.

Other problems and new features of the present invention will be clearly understood by the following detailed description in connection with the accompanying drawings.

A semiconductor device according to one embodiment of the invention includes a semiconductor substrate, a photoelectric conversion element, a first isolation insulating film, and a current blocking region. The semiconductor substrate has a main surface, and the photoelectric conversion element is formed in the semiconductor substrate. The first isolation insulating film is formed around the photoelectric conversion element over the main surface. The current blocking region is formed in a region between the photoelectric conversion element and the first isolation insulating film over the main surface. The current blocking region includes an impurity diffusion layer, and a defect extension preventing layer adapted to form a twin with the impurity diffusion layer by being in contact with the impurity diffusion layer. The defect extension preventing layer has a different crystal structure from that of the impurity diffusion layer. At least a part of the current blocking region is disposed in contact with the first isolation insulating film.

In a method for manufacturing a semiconductor device according to one embodiment of the invention, first, a semiconductor substrate with a main surface is provided. A first isolation insulating film is formed in the main surface. After the step of forming the first isolation insulating film, a current blocking region is formed at the main surface so as to be adjacent to the first isolation insulating film. A photoelectric conversion element is formed in the semiconductor substrate on a side opposite to the first isolation insulating film so as to sandwich the current blocking region with the first isolation insulating film. In forming the current blocking region, a defect extension preventing layer is formed. After formation of the defect extension preventing layer, an impurity diffusion layer with a different crystal structure from the defect extension preventing layer is brought into contact with the defect extension preventing layer from directly above the defect extension preventing layer to thereby form a twin with the defect extension preventing layer. During forming the current blocking region, at least apart of the current blocking region is formed to be in contact with the first isolation insulating film.

According to this embodiment, the impurity diffusion layer and the defect extension preventing layer form the twin, which suppresses the pixel defects inside the current blocking region from extending up to the main surface of the semiconductor substrate. Thus, even though there is provided the current blocking region having a high impurity concentration with the high concentration of pixel defects, this embodiment can suppress the occurrence of false recognition of a pixel signal or the like. Specifically, this embodiment can achieve both the suppression of the leak current between a pair of adjacent photoelectric conversion elements as well as the suppression of detection of the pixel defects in the photoelectric conversion element. Therefore, the invention can provide the semiconductor device and manufacturing method thereof that can detect the pixel signal with very high reliability.

DETAILED DESCRIPTION

In the following, preferred embodiments of the present invention will be described with reference to the accompanying drawings.

First Embodiment

First, a semiconductor device in a wafer state according to this embodiment will be described using FIGS. 1 and 2.

Figure 1:
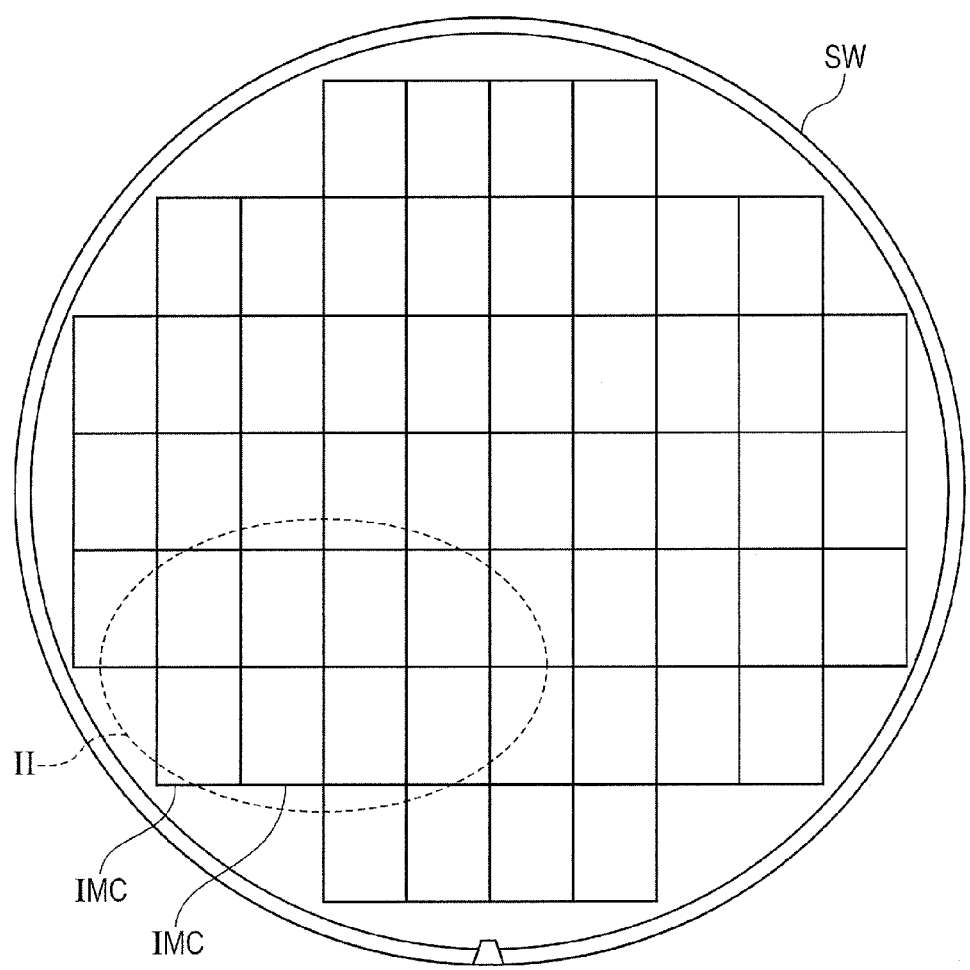
FIG. 1 is a schematic plan view showing the state of a wafer in a semiconductor device according to a first embodiment of the invention.

Referring to FIG. 1, a semiconductor wafer SW has chip regions IMC with a plurality of semiconductor devices for an image sensor mounted thereover. The chip regions IMC have a rectangular planar shape, and are arranged in a matrix.

Figure 2:
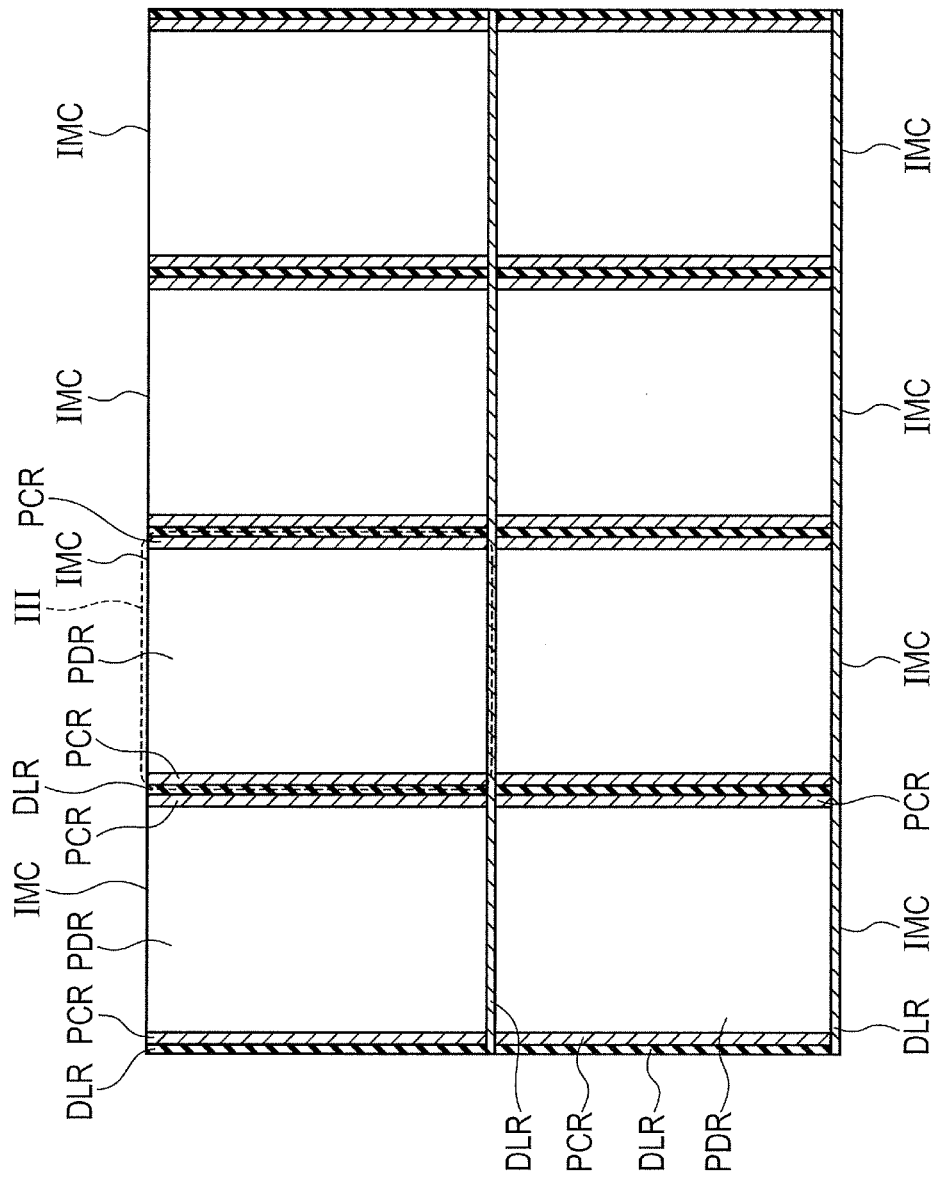
FIG. 2 is a schematic enlarged plan view of a region II enclosed by a circle with a dotted line shown in FIG. 1.

Referring to FIG. 2, each of the chip regions IMC includes a pixel region PDR serving as a formation region for a photoelectric conversion element such as a photodiode, and peripheral circuit regions PCR serving as a formation region for a peripheral circuit for controlling the photodiode. The peripheral circuit regions PCR are formed, for example, on both sides of the pixel region PDR. A dicing line region DLR is formed between the chip regions IMC. An alignment mark is disposed in the dicing line region DLR. The semiconductor wafer SW is subjected to dicing in the dicing line region DLR into a plurality of semiconductor chips.

Thus, each of the semiconductor chips divided has a rectangular planar shape, and includes the pixel region PDR, the peripheral circuit regions PCR, and the dicing line regions DLR.

Next, the structure of the image sensor in this embodiment, specifically, the pixel region in both the wafer state and chip state will be described with reference to FIGS. 3 to 5.

Figure 3:
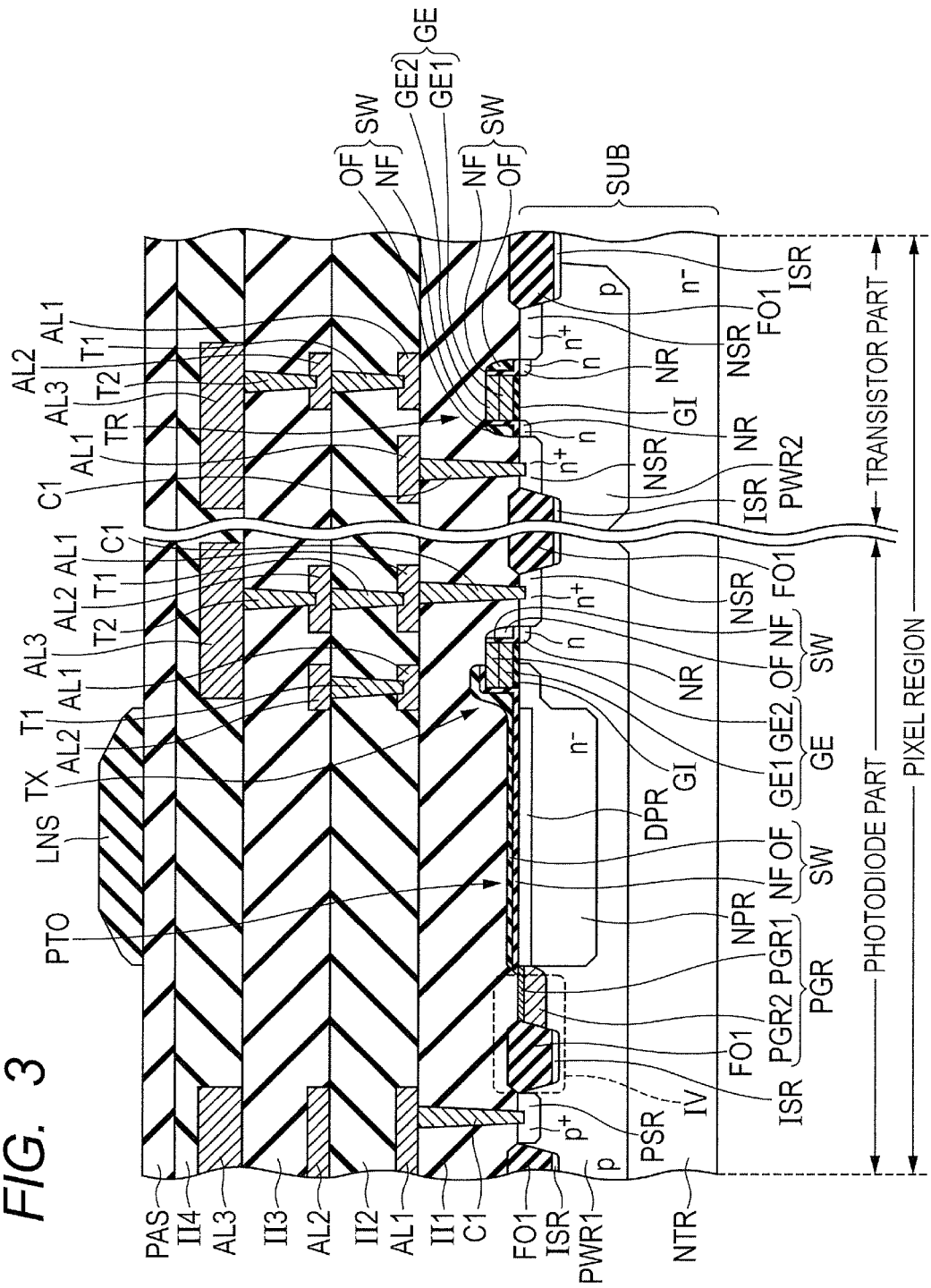
FIG. 3 is a schematic cross-sectional view showing a first example of the structure of the semiconductor device in the first embodiment.

Referring to FIG. 3, the image sensor of this embodiment includes a photodiode part and a transistor part in the pixel region (corresponding to the pixel region PDR of FIG. 2). The photodiode part has a photodiode PTO formed as the photoelectric conversion element, and the transistor part has a transistor TR for control formed therein.

Specifically, the image sensor is formed in an n⁻region of the semiconductor substrate SUB made of, for example, silicon. The photodiode part and the transistor part are isolated from each other by a field oxide film FO1 (first isolation insulating film) formed at the surface of the semiconductor substrate SUB in the planar view. Within the photodiode part, the photodiode PTO and for example, a high-concentration p-type region PSR (high-concentration region for coupling with an upper layer wiring) disposed around the photodiode are isolated from each other by the field oxide film FO1 in the planar view.

A p-type well region PWR1 is formed over the surface of the semiconductor substrate SUB within the photodiode part. An n-type impurity region NPR is formed over the surface of the semiconductor substrate SUB within the p-type well region PWR1, and a p-type impurity region DPR is formed over the surface of the semiconductor substrate SUB within the n-type impurity region NPR. A p-n junction is formed between the n-type impurity region NPR and the p-type impurity region DPR. The photodiode PTO is formed of the n-type impurity region NPR and the p-type impurity region DPR within the semiconductor substrate SUB.

The photodiode part also includes a metal insulator semiconductor (MIS) transistor, such as a transistor TX for transmission. Specifically, the transistor TX for transmission includes a pair of source and drain regions NPR, NR, and NSR, a gate insulating film GI, and a gate electrode GE. The pair of n-type source and drain regions NPR, and NR and NSR is arranged with a spacing therebetween over the surface of the semiconductor substrate SUB within the p-type well region PWR1. One region NPR of the pair of n-type source and drain regions NPR, NR, and NSR is integrated with and electrically coupled to the n-type impurity region NPR of the photodiode PTO. The other regions NR and NSR of the pair of source and drain regions NPR, NR, and NSR includes a high-concentration n-type region NSR as the high-concentration region, and an n-type impurity region NR as a lightly doped drain (LDD).

The gate electrode GE is formed over the surface of the semiconductor substrate SUB via the gate insulating film GI to be sandwiched between the pair of source and drain regions NPR and n-type impurity region NR and NSR. The gate electrode GE includes a first gate electrode GE1 which is a thin film made of, for example, polycrystalline silicon, and a second gate electrode GE2 which is one kind of a silicon oxide film made of, for example, TEOS (tetraethyl orthosilicate), and which is stacked over an upper surface of the first gate electrode GE1.

A reflection preventing film including a laminated structure of a silicon oxide film OF and a silicon nitride film NF is formed over the surface of the semiconductor substrate SUB to cover the photodiode PTO. One end of the reflection preventing films OF and NF rides on one of the gate electrode GE. As the remainder of the reflection preventing films OF and NF, a sidewall insulating layer including the silicon oxide film OF and the silicon nitride film NF is formed over the other sidewall of the gate electrode GE.

The above-mentioned high-concentration p-type region PSR is formed over the surface of the semiconductor substrate SUB in the p-type well region PWR1 to couple with an upper layer wiring.

A field oxide film FO1 and a guard ring PGR (current blocking region) are formed around the photodiode PTO over the surface of the semiconductor substrate SUB, that is, for example, between the photodiode PTO and the high-concentration p-type region PSR. The field oxide film FO1 and the guard ring PGR are formed in contact with each other to be arranged side by side over the surface of the semiconductor substrate SUB. Preferably, the field oxide film FO1 is formed to be in contact with the high-concentration p-type region PSR and the guard ring PGR, and the guard ring PGR is formed to be in contact with the field oxide film FO1 and the photodiode PTO (in other words, to be sandwiched between the field oxide film FO1 and the photodiode PTO in contact with both these elements).

Figure 4:
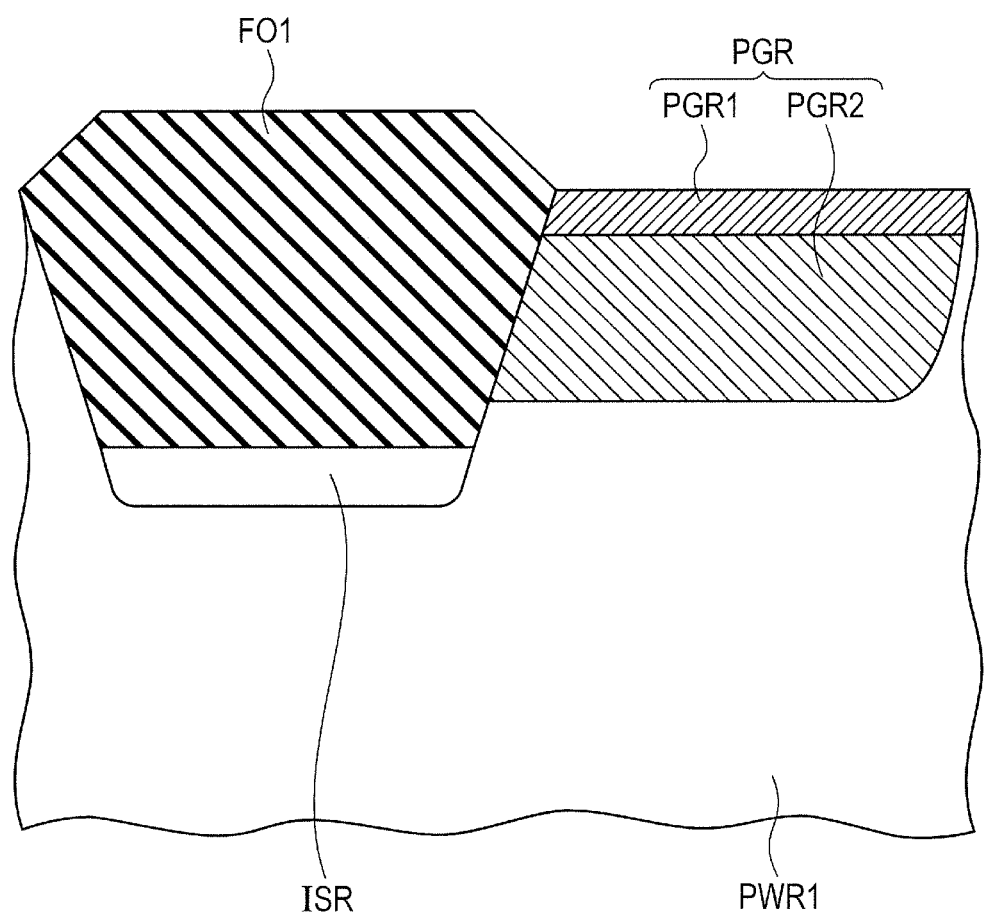
FIG. 4 is a schematic enlarged plan view showing a region IV enclosed by a circle with a dotted line shown in FIG. 3.

Referring to FIG. 4, the field oxide film FO1 is a LOCOS oxide film that is formed over the surface of the semiconductor substrate SUB (p-type well region PWR1) to have a shape expanding toward both the upper and lower sides of the surface of the semiconductor substrate SUB. That is, the field oxide film FO1 is formed, for example, by oxidizing silicon contained in the semiconductor substrate SUB using the so-called local oxidation of silicon (LOCOS) method to be described later. The field oxide film FO1 electrically isolates the photodiodes PTO formed over the semiconductor substrate SUB from each other.

A p-type isolation region ISR (diffusion region for isolation) is disposed outside the field oxide film FO1 so as to be in contact with the bottom surface of the field oxide film FO1 (a surface in the deepest region from the surface of the semiconductor substrate SUB). The field oxide film FO1 is formed of a silicon oxide film, and serves to electrically isolate two regions from one another. The p-type isolation region ISR is formed for the purpose of reinforcing an electric isolation effect when the depth of the field oxide film FO1 from the surface of the semiconductor substrate SUB is shallow and only the presence of the field oxide film FO1 weakens the function of the field oxide film FO1 itself, specifically, the function of electrically isolating two regions from each other. The p-type isolation region ISR is formed by implanting p-type impurities. As shown in FIGS. 3 and 4, the p-type isolation region ISR is formed to be in contact with only the lower bottom surface of the field oxide film FO1. Alternatively, the p-type isolation ISR may be diffused toward the side of the lower side surface of the field oxide film FO1 to be in contact with both the bottom surface and the side surfaces of the field oxide film FO1.

The guard ring PGR is formed for the purpose of enforcing the function of electrically isolating the photodiode PTO from its peripheral part, which function is achieved by the field oxide film FO1 around the photodiode PTO. For this reason, the guard ring PGR is disposed to be adjacent on the side of the photodiode PTO (on the left side in FIG. 3) of the transfer transistor TX at the surface of the semiconductor substrate SUB.

The guard ring PGR includes an impurity diffusion layer PGR2, and a defect extension preventing layer PGR1. The impurity diffusion layer PGR2 is a region into which the well-known p-type impurities are diffused to extend from the surface of the semiconductor substrate SUB in the depth direction of the semiconductor substrate SUB.

On the other hand, the defect extension preventing layer PGR1 is a region that is formed over the surface of the semiconductor substrate SUB so as to be superimposed over the impurity diffusion layer PGR2 in the planar view. The defect extension preventing layer PGR1 is formed in such a position as to be superimposed over the impurity diffusion layer PGR2 to be shallower than the impurity diffusion layer PGR2. Thus, in the guard ring PGR, the defect extension preventing layer PGR1 is formed over the main front surface side (upper side shown in FIG. 3) of the semiconductor substrate SUB with respect to the impurity diffusion layer PGR2. However, the invention is not limited to such an embodiment. The defect extension preventing layer PGR1 may be disposed, for example, on the side opposite to the main surface of the semiconductor substrate SUB (on the lower side shown in FIG. 3) with respect to the impurity diffusion layer PGR2. Alternatively, the defect extension preventing layer PGR1 and the impurity diffusion layer PGR2 may be arranged in parallel with each other in the horizontal direction.

The defect extension preventing layer PGR1 is formed by recrystallization of an amorphous structure that is generated by breakage of a silicon crystal structure of the semiconductor substrate SUB in a region where the impurity diffusion layer PGR2 is to be formed. Thus, the defect extension preventing layer PGR1 differs from the impurity diffusion layer PGR2 in crystal structure because the impurity diffusion layer PGR2 is formed by simply implanting and diffusing p-type impurities into the silicon crystal structure of the semiconductor substrate SUB.

As will be described later, the impurity diffusion layer PGR2 is formed more deeply than the defect extension preventing layer PGR1 by implanting impurities directly above the region where the defect extension preventing layer PGR1 is formed. The defect extension preventing layer PGR1 and the impurity diffusion layer PGR2 are formed to be in contact with each other at the lowermost part (at the boundary between the defect extension preventing layer PGR1 and the impurity diffusion layer PGR2) of the defect extension preventing layer PGR1. P-type impurities contained in the impurity diffusion layer PGR2 are also contained in the defect extension preventing layer PGR1. The term "impurity diffusion layer PGR2" as used herein means the region located under the defect extension preventing layer PGR1 and not including the defect extension preventing layer PGR1.

The defect extension preventing layer PGR1 and the impurity diffusion layer PGR2 have different crystal structures. These two layers PGR1 and PGR2 are in contact with each other to form a twin.

At least a part of the guard ring PGR is disposed in contact with at least a part of the field oxide film FO1 (with the surface of the guard ring in contact with the surface of the field oxide film) adjacent to the guard ring (on the left side shown in FIG. 3). Thus, the guard ring PGR can reinforce the function of electrically isolating the photodiode PTO from its peripheral part, which function is achieved by the field oxide film FO1 around the photodiode PTO.

The defect extension preventing layer PGR1 preferably contains at least one element selected from the group comprised of nitrogen, silicon, germanium, fluorine, and argon, and in particular, more preferably a material with a larger atomic weight among these elements. The defect extension preventing layer PGR1 is a region formed by implanting neutral impurities without a p-type or n-type polarity. At this time, impurities of material with a larger atomic weight are preferably implanted therein. In contrast, the impurity diffusion layer PGR2 is a region containing a p-type impurity, for example, boron (B).

The defect extension preventing layer PGR1 is formed from the surface of the semiconductor substrate SUB up to a region that preferably extends to a depth of 40 nm or more in a direction vertical to the surface thereof, and more preferably to a depth of 50 nm or more.

Although FIG. 3 illustrates the guard ring PGR more widely than the relative actual size thereof to other regions in order to emphasize the existence of the guard ring PGR, the guard ring PGR may be actually formed more narrowly than the relative size shown in FIG. 3.

Returning to FIG. 3, next, for example, a p-type well region PWR2 is formed at the surface (n⁻region) of the semiconductor substrate SUB in the transistor part. The p-type well region PWR2 has a control element formed therein to control the operations of the photodiodes PTO. The control element includes, for example, a MIS transistor TR.

Specifically, the MIS transistor TR includes a pair of n-type source and drain regions NR and NSR, the gate insulating film GI, and the gate electrode GE. The respective regions of the pair of n-type source and drain regions NR and NSR are formed at the surface of the semiconductor substrate SUB with a spacing therebetween. The pair of n-type source and drain regions NR and NSR includes the high-concentration n-type region NSR as the high-concentration region, and an n-type impurity region NR as the LDD.

The gate electrode GE is formed over the surface of the semiconductor substrate SUB via the gate insulating film GI to be sandwiched between the pair of n-type source and drain regions NR and NSR. A sidewall insulating layer including a nitride film NF and an oxide film OF is formed as the remainder of the reflection preventing film at each sidewall of the gate electrode GE.

Suitable materials for the gate electrode GE of each MIS transistor of the photodiode part and the transistor part may be polycrystalline silicon doped with impurities, or for example, may be made of metal, such as TiN.

An interlayer insulating film II1 is formed over the surface of the semiconductor substrate SUB in each of the photodiode part and transistor part to cover the above-mentioned elements (photodiode PTO, and MIS transistors TX and TR). A first layer of a patterned metal wiring AL1 is formed over the interlayer insulating film II1 in the photodiode part and the transistor part. The first layer of the metal wiring AL1 is electrically coupled to, for example, the high-concentration p-type region PSR or the high-concentration n-type region NSR through a conductive layer C1 filling in a contact hole of the interlayer insulating film II1.

An interlayer insulating film II2 is formed over the interlayer insulating film II1 to cover the metal wiring AL1. A second layer of a patterned metal wiring AL2 is formed over the interlayer insulating film II2 in the photodiode part and the transistor part. The second layer of the metal wiring AL2 is electrically coupled to the first layer of the metal wiring AL1 through a conductive layer T1 filling a through hole of the interlayer insulating film II2.

An interlayer insulating film II3 is formed over the interlayer insulating film II2 to cover the metal wiring AL2. A third layer of a patterned metal wiring AL3 is formed over the interlayer insulating film II3 in the photodiode part and the transistor part. The third layer of the metal wiring AL3 is electrically coupled to the second layer of the metal wiring AL2 through a conductive layer T2 filling a through hole of the interlayer insulating film II3. The metal wiring AL3 serves as an electrode pad in the form of uppermost layer wiring, and thus is preferably formed more thickly than other metal wirings AL1 and AL2.

The metal wirings AL1, AL2, and AL3 are made of, for example, aluminum (Al) or copper (Cu). The conductive layers C1, T1, and T2 are made of, for example, tungsten.

An interlayer insulating film II4 is formed over the interlayer insulating film II3 to cover the metal wiring AL3 in the photodiode part and transistor part. A passivation film PAS is formed over the interlayer insulating film II4. Over the passivation film PAS, a condenser lens LNS is disposed directly above the photodiode PTO. The condenser lens LNS is to collect lights and irradiate the photodiode PTO with the light.

In the above-mentioned structure, the interlayer insulating films II1, II2, II3, and II4 are made of, for example, a silicon oxide film, that is, material having an etching selectivity different from that of the metal wiring AL1 as a stopper film made of metal (for example, the etching selectivity in etching of the interlayer insulating films II2 and II3 for forming the through hole for the conductive layers T1 and T2). Although not shown, the sidewalls and bottom walls of the through holes for formation of the conductive layers C1, T1, and T2 may be provided with a barrier metal.

FIG. 3 shows one photodiode PTO and one switching element TX in the photodiode part, and one transistor TR for control in the transistor part. Actually, however, in the respective chip regions IMC, for example, as shown in FIG. 1, the photodiodes PTO and the switching elements TX are arranged at intervals.

Figure 5:
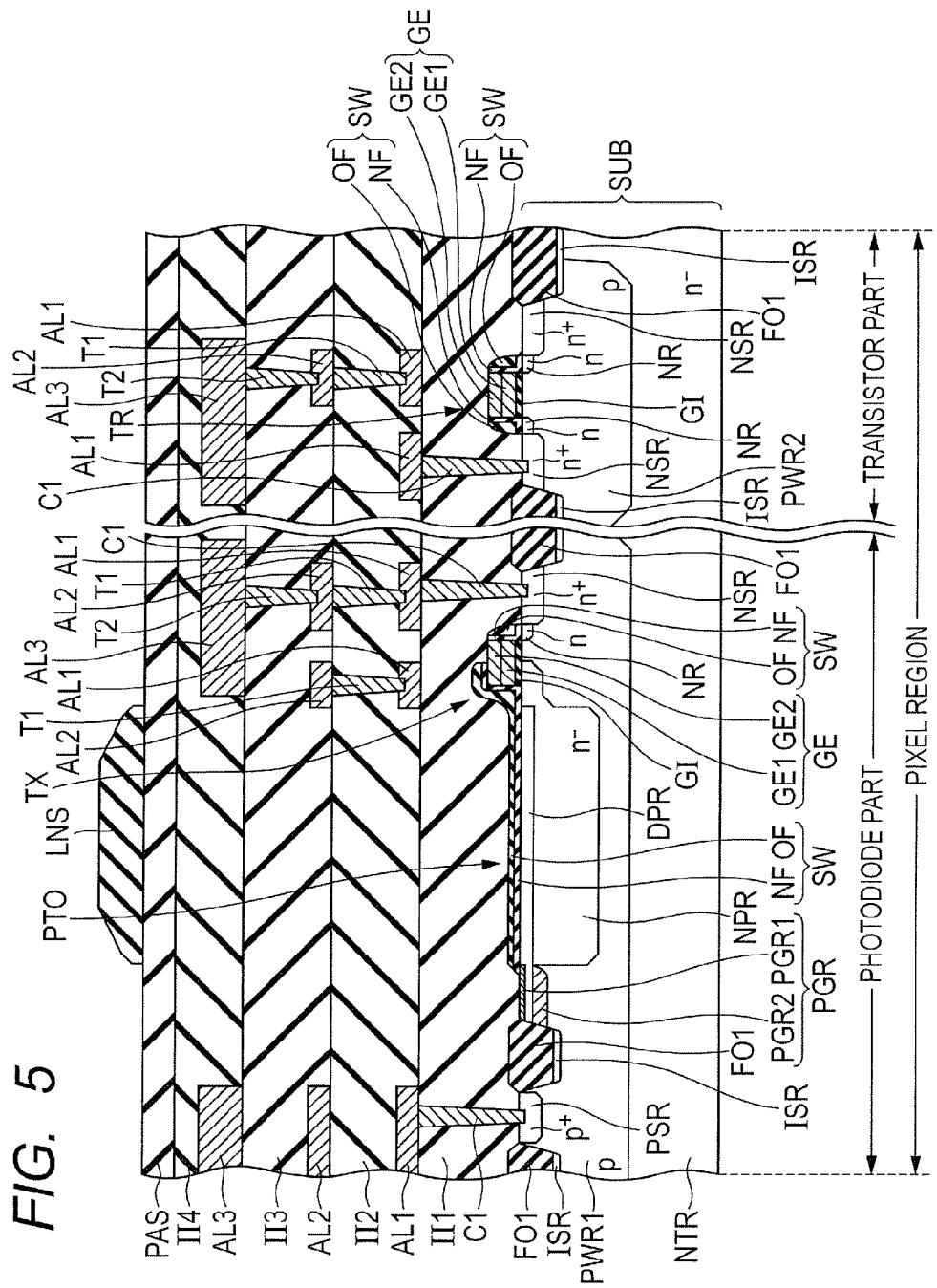
FIG. 5 is a schematic cross-sectional view showing a second example of the structure of the semiconductor device in the first embodiment.

Referring to FIG. 5, a second example of this embodiment differs from the first example of FIG. 3 in that a p-type impurity region DPR included in the photodiode PTO extends over the surface of the semiconductor substrate SUB from the inside of an n-type impurity region NPR to the guard ring PGR adjacent to the region DPR. The structure shown in FIG. 5 is the same as that shown in FIG. 3 in other points. The same elements are designated by the same reference numerals, and thus a description thereof will not be repeated.

As shown in FIG. 5, the p-type impurity region DPR may be formed to enter the guard ring PGR. In this case, basically, the defect extension preventing layer PGR1 of the guard ring PGR is formed more shallowly than the p-type impurity region DPR, whereby the p-type impurity region DPR is formed to be superimposed over parts of the defect extension preventing layer PGR1 and impurity diffusion layer PGR2. For example, when the p-type impurity region DPR contains boron and the impurity diffusion layer PGR2 also contains boron, boron of the p-type impurity region DPR is additionally introduced into the impurity diffusion layer PGR2, which enhances the concentration of boron impurities in the impurity diffusion layer PGR2. Thus, the guard ring PGR can enhance its function of electrically isolating the photodiode PTO from the outside.

Now, a manufacturing method of the semiconductor device for an image sensor shown in FIG. 5 of this embodiment will be described with reference to FIGS. 6 to 22.

Figure 6:
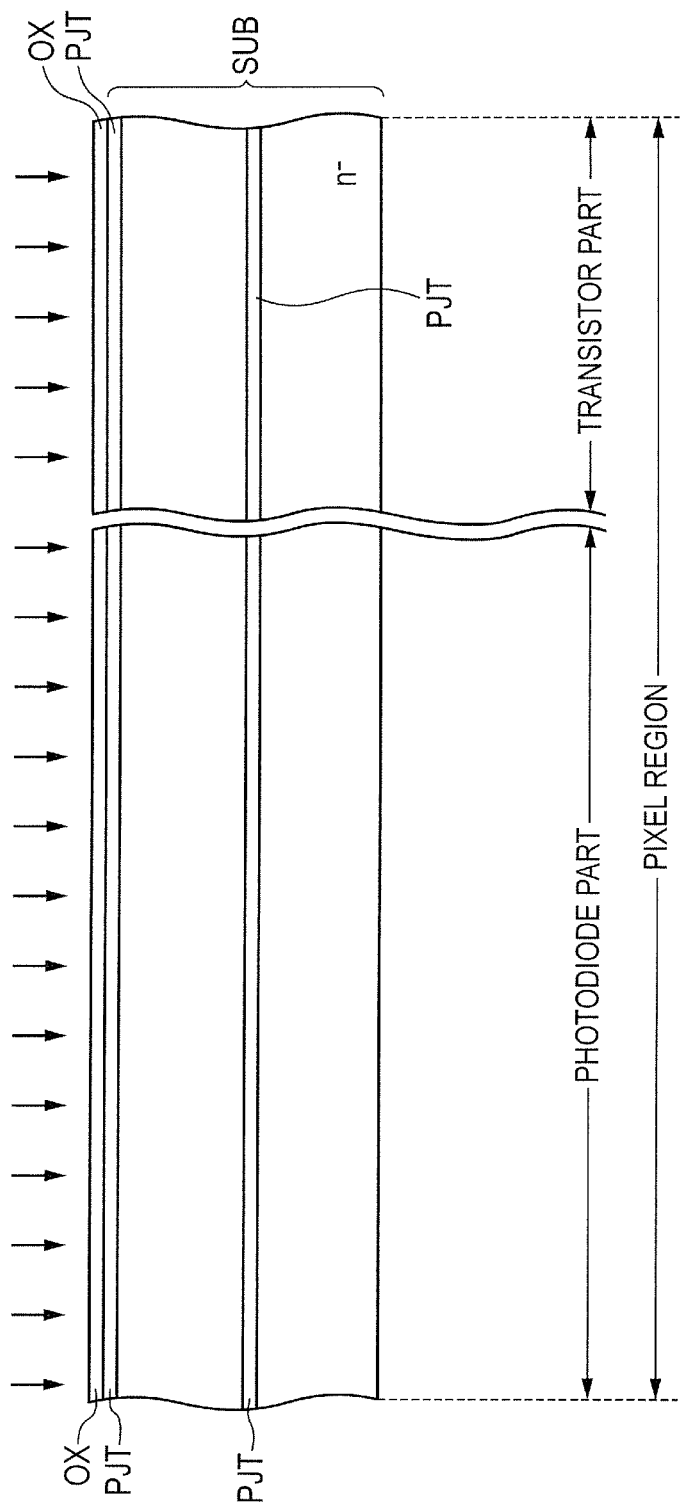
FIG. 6 is a schematic cross-sectional view showing a first step of a manufacturing method of the semiconductor device in the first embodiment.

Referring to FIG. 6, first, a silicon semiconductor substrate SUB with a main surface (front surface) is provided. Note that a germanium semiconductor substrate SUB may be used instead of silicon according to a wavelength of light applied in use of the formed semiconductor device. The use of the silicon semiconductor substrate SUB will be described below.

An n⁻ region comprised of an n⁻ epitaxial growth layer is formed over the surface of the semiconductor substrate SUB. Then, a silicon oxide film OX is formed over one main surface of the semiconductor substrate SUB. Specifically, the silicon oxide film OX is formed over the substantially entire main surface of the semiconductor substrate SUB, including both the photodiode part and the transistor part in the pixel region, for example, by thermal oxidation. The thickness of the silicon oxide film OX is preferably equal to or more than 10 nm.

Thereafter, impurity ions, such as boron, are implanted by normal ion implantation into the semiconductor substrate SUB from the substantially entire surface of the semiconductor substrate SUB on the side of the main surface with the silicon oxide film OX formed thereover, thereby forming an implantation layer PJT. At this time, the silicon oxide film OX serves to control the depth of the implantation of the impurity ions such as boron.

The ion implantation is preferably performed twice. The first ion implantation is preferably performed in such a way that impurity ions of boron are implanted, for example, at an implantation energy of 1000 keV or more in a dose amount of $1.0 \times 10^{13}$ cm$^{-2}$ or more. Thus, an implantation layer PJT is formed in a relatively deep region of the semiconductor substrate SUB. The second ion implantation is preferably performed in such a way that impurity ions of boron are implanted, for example, at an implantation energy of 10 keV or more in a dose amount of $1.0 \times 10^{12}$ cm$^{-2}$ or more. In each ion implantation, the impurity ions are preferably supplied at an inclination angle of 0 degree (at an angle with respect to the direction vertical to the main surface of the semiconductor substrate SUB). Thus, the implantation layer PJT is formed in a relatively shallow region of the semiconductor substrate SUB.

Figure 7:
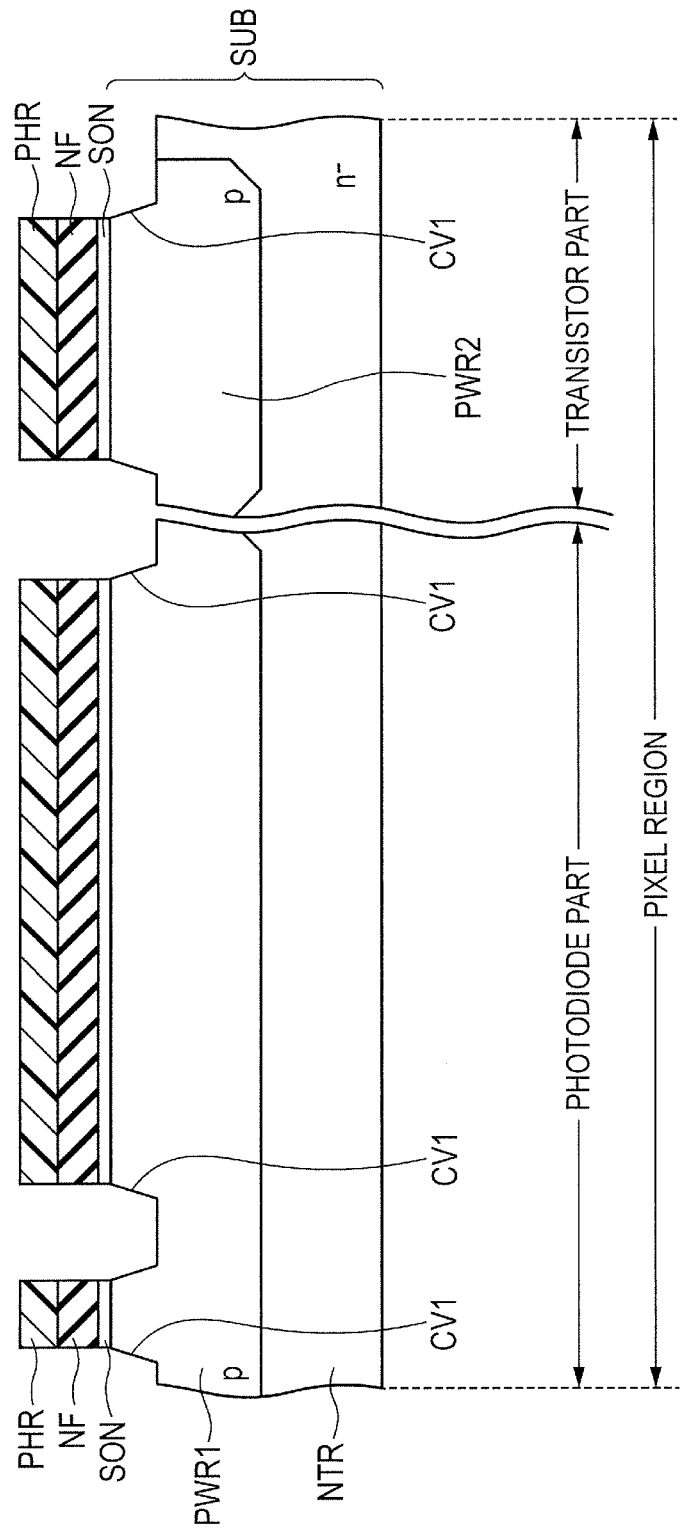
FIG. 7 is a schematic cross-sectional view showing a second step of the manufacturing method of the semiconductor device in the first embodiment.

Referring to FIG. 7, the semiconductor substrate SUB with the implantation layer PJT formed thereat is subjected to heat measures, so that the impurity ions of the implantation layer PJT are diffused into the semiconductor substrate SUB to thereby form the p-type well region PWR1 in the photodiode part, and the p-type well region PWR2 in the transistor part, respectively. The depths of the p-type well region PWR1 and p-type well region PWR2 are arbitrarily set. The well regions PWR1 and PWR2 may be formed to have substantially the same depth as shown in FIG. 7. Note that at this time, the silicon oxide film OX serves to suppress the emission of the implanted impurity ions from the main surface of the semiconductor substrate SUB to the outside upon the heat treatment.

Then, after removal of the silicon oxide film OX, a silicon oxynitride film SON and a silicon nitride film NF are formed in that order by a chemical vapor deposition (CVD) method over the main surface of the semiconductor substrate SUB with the silicon oxide film OX formed thereover. The thickness of the silicon oxynitride film SON is preferably 10 nm or more, and the thickness of the silicon nitride film NF is preferably 50 nm or more. A photoresist PHR is applied as a photosensitive member to the silicon nitride film NF, and then subjected to normal photoengraving and etching to thereby etch and remove parts of the silicon oxynitride film SON, silicon nitride film NF, and p-type well regions PWR1 and PWR2 in the regions where the field oxide film FO1 is to be superimposed in the planar view. As a result, concave portions CV1 are formed in the main surface of the semiconductor substrate SUB.

Figure 8:
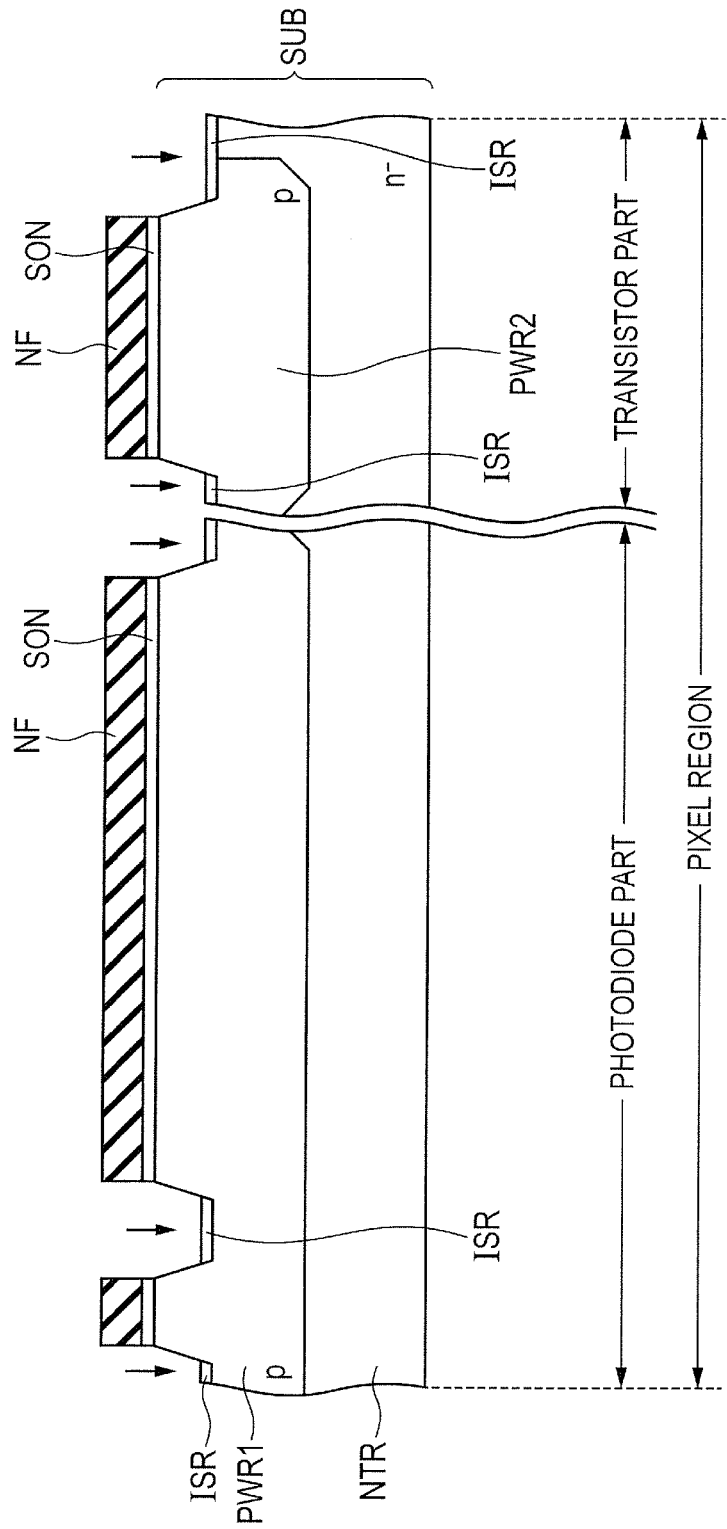
FIG. 8 is a schematic cross-sectional view showing a third step of the manufacturing method of the semiconductor device in the first embodiment.

Referring to FIG. 8, after the photoresist PHR is removed by ashing or the like, impurity ions, such as boron, are implanted by the normal ion implantation into the region outside (directly under) each concave portion CV1 in contact with the bottom surface of the concave portion CV1 using a pattern of the silicon nitride film NF as a mask. As a result, a p-type isolation region ISR is formed as a diffusion region for isolation in the region outside (directly under) the concave portion CV1 in contact with the bottom surface of the concave portion CV1. At this time, the impurity ions are supplied at an inclination angle of 0 degree, for example, at an implantation energy of 50 keV or more in a dose amount of $1.0 \times 10^{13}$ cm$^{-2}$ or more, thereby forming the p-type isolation regions ISR.

Figure 9:
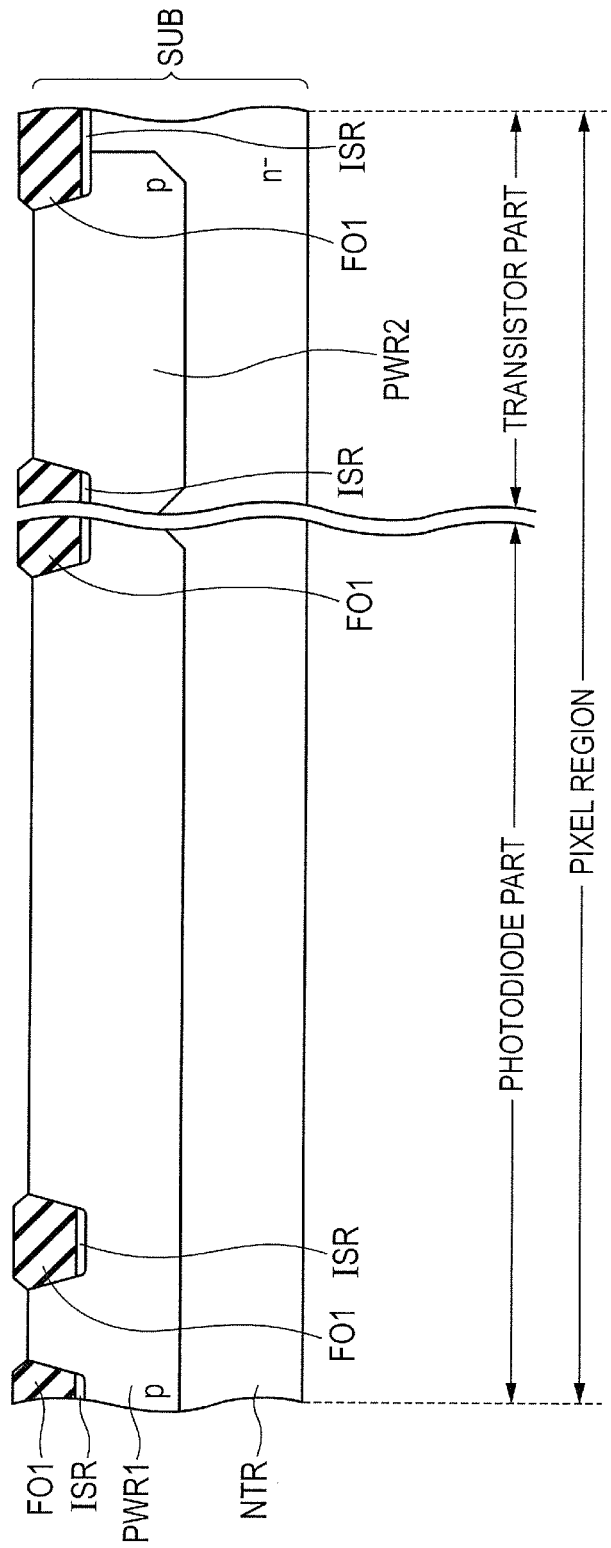
FIG. 9 is a schematic cross-sectional view showing a fourth step of the manufacturing method of the semiconductor device in the first embodiment.

Referring to FIG. 9, the field oxide film FO1 is formed of a silicon oxide film over the bottom side wall parts of each concave portion CV1 (bottom surface and side parts of the inner walls thereof), for example, by thermal oxidation. Specifically, the silicon at the bottom side wall parts of the concave portion CV1 is oxidized by the thermal oxidation to fill the concave portion CV1 with the field oxide film FO1 made of the silicon oxide film. Although not shown, at this time, a photoresist PHR may be applied over an upper surface of the silicon nitride film NF.

Thereafter, the silicon nitride film NF and the silicon oxynitride film SON are removed to form the field oxide film FO1 that has its uppermost surface expanding upward and downward with respect to the main surface (p-type well regions PWR1 and PWR2) of the semiconductor substrate SUB. The formation technique of a local oxide film by the thermal oxidation is called a "LOCOS method", in which the field oxide film FO1 thus formed is called a "LOCOS oxide film". As mentioned above, the field oxide film FO1 is formed as the so-called field oxide film.

Figure 10:
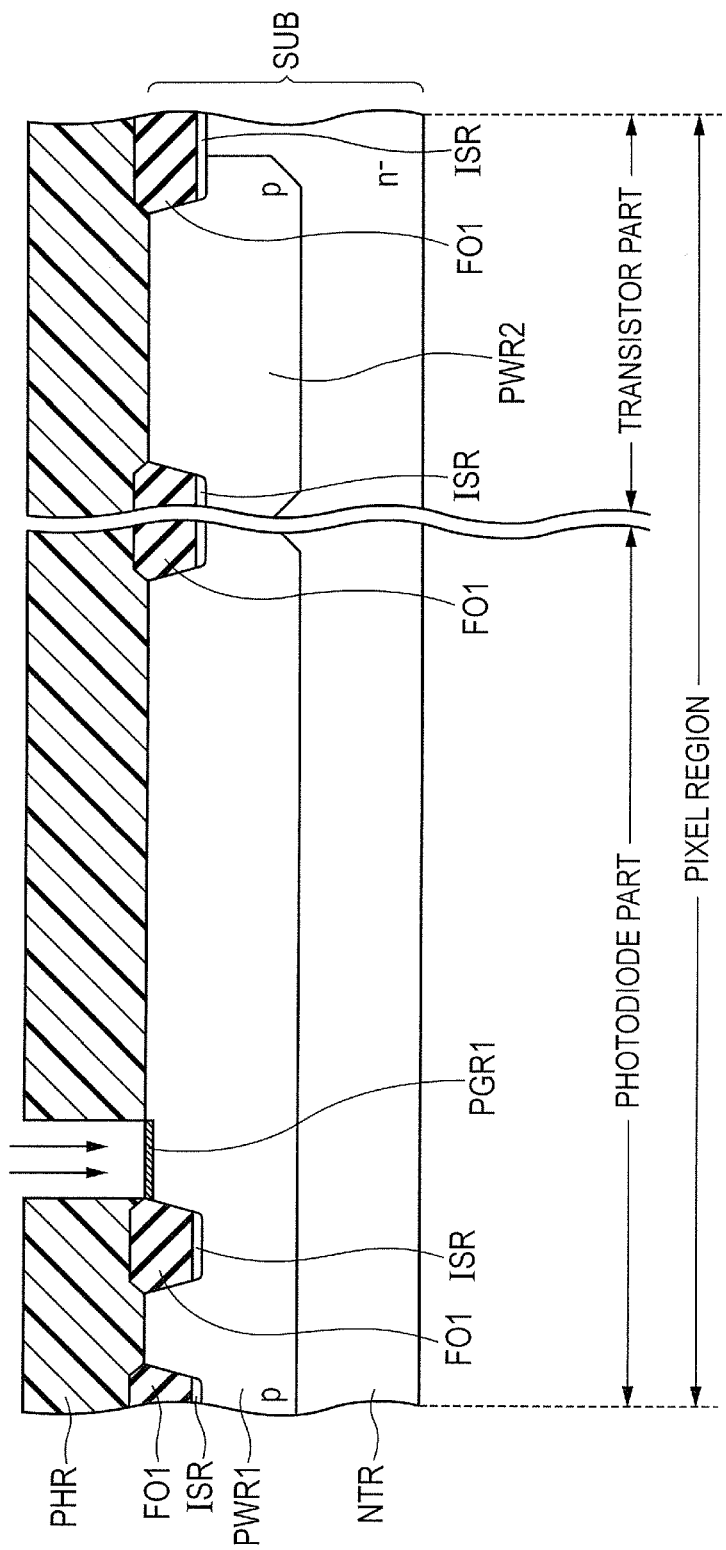
FIG. 10 is a schematic cross-sectional view showing a fifth step of the manufacturing method of the semiconductor device in the first embodiment.

Referring to FIG. 10, a pattern of the photoresist PHR is formed by the normal photoengraving, especially in the photodiode part, and has an opening located in a region that is planarly superimposed over a region where the guard ring PGR is to be formed. By the normal ion implantation technique using the pattern of the photoresist PHR, the defect extension preventing layer PGR1 is formed by ion-implanting impurity ions, such as nitrogen, from the main surface in the region where the guard ring PGR is to be formed into the semiconductor substrate SUB. At this time, the ion implantation is preferably performed, specifically, at an implantation energy of 10 keV or more in a dose amount of $1.0 \times 10^{14}$ cm$^{-2}$ or more, and for example, at an implantation energy of 20 keV in a dose amount of $1.0 \times 10^{15}$ cm$^{-2}$ at an inclination angle of 0 degree. The defect extension preventing layer PGR1 is preferably formed from the main surface of the semiconductor substrate SUB (p-type well region PWR1) to a region in the depth of 40 nm or more in the direction vertical to the main surface (in a vertical direction respective to the figure).

The defect extension preventing layer PGR1 may be formed by implanting impurity ions other than nitrogen described above. The defect extension preventing layer PGR1 preferably contains at least one element selected from the group comprised of nitrogen, silicon, germanium, fluorine, and argon. The above-mentioned material can be implanted in the form of neutral impurity ion having no p-type or n-type polarity. By implanting these impurity ions, the silicon crystal structure of the semiconductor substrate SUB with the ions implanted thereinto is broken to be transformed into an amorphous structure. The region finally becomes the defect extension preventing layer PGR1.

In order to enhance the effect of transforming the silicon crystal structure of the existing semiconductor substrate SUB into the amorphous structure during forming the defect extension preventing layer PGR1, the impurity ions supplied for the ion implantation are preferably made of material that cause large damage to the silicon implanted. From this point, the impurity ion of material having a relatively large atomic weight (for example, germanium, or silicon) among the respective materials is preferably used.

Figure 11:
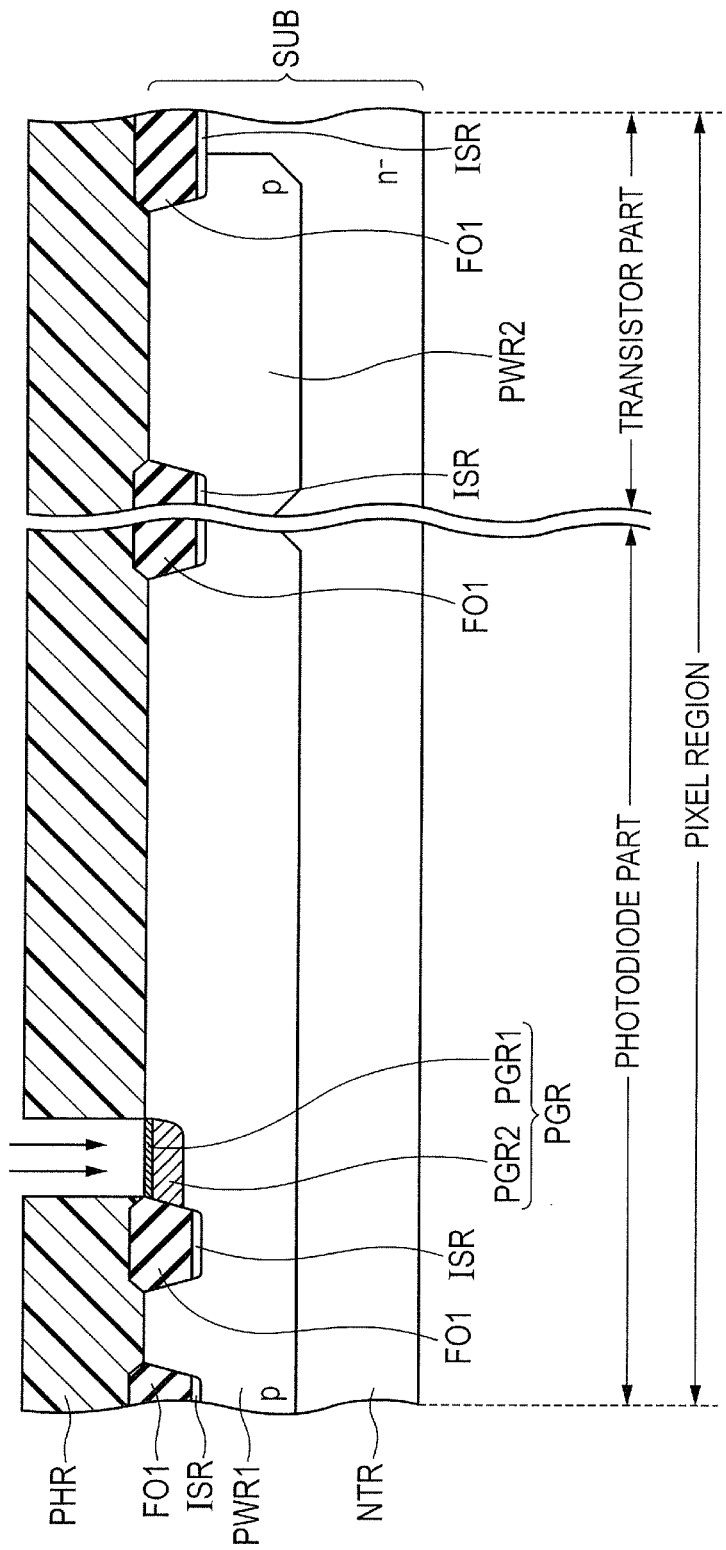
FIG. 11 is a schematic cross-sectional view showing a sixth step of the manufacturing method of the semiconductor device in the first embodiment.

Referring to FIG. 11, after the defect extension preventing layer PGR1 is formed, the impurity ions, such as boron, are implanted by the normal ion implantation into the semiconductor substrate SUB from the main surface of the semiconductor substrate SUB in the region that is superimposed over the defect extension preventing layer PGR1 in the planar manner. In this way, the impurity diffusion layer PGR2 that contains boron is formed. The thus-formed impurity diffusion layer PGR2 differs from the defect extension preventing layer PGR1 in crystal structure.

The ion implantation is preferably performed twice. The first ion implantation is preferably performed in such a way that impurity ions of boron are implanted, specifically, at an implantation energy of 100 keV or more in a dose amount of $1.0 \times 10^{13}$ cm$^{-2}$ or more, and for example, at an implantation energy of 1 keV in a dose amount of $2.0 \times 10^{13}$ cm$^{-2}$ at an inclination angle of 0 degree. The second ion implantation is preferably performed in such away that impurity ions of boron are implanted, specifically, at an implantation energy of 30 keV or more in a dose amount of $1.0 \times 10^{13}$ cm$^{-2}$ or more, and for example, at an implantation energy of 50 keV in a dose amount of $5.0 \times 10^{13}$ cm$^{-2}$ at an inclination angle of 0 degree.

Thus, the impurity diffusion layer PGR2 made of impurity ions of boron are formed from the main surface of the semiconductor substrate SUB to the deeper region than the defect extension preventing layer PGR1. Conversely, the defect extension preventing layer PGR1 is formed on the side of the main front surface (upper side shown in FIG. 11 close to the main surface) of the semiconductor substrate SUB with respect to the impurity diffusion layer PGR2. Thus, the impurity diffusion layer PGR2 is formed to be superimposed over the defect extension preventing layer PGR1 to be brought into contact with the defect extension preventing layer PGR1. In particular, the impurity diffusion layer PGR2 is formed up to the deeper region than the defect extension preventing layer PGR1, whereby at least a part of the impurity diffusion layer PGR2 (guard ring PGR) is formed to be in contact with the field oxide film FO1. The photoresist PHR is removed, for example, by ashing.

After forming the guard ring PGR, a heat treatment called a rapid thermal anneal (RTA) is performed. Specifically, the semiconductor substrate SUB is preferably heated, for example, at 1100 degrees for thirty seconds while being exposed to a nitrogen atmosphere. The thermal treatment recrystallizes the formation region of the defect extension preventing layer PGR1 having an amorphous structure, while activating the region with the guard ring PGR formed therein. Thus, the defect extension preventing layer PGR1 and the impurity diffusion layer PGR2 which have different crystal structures form the twin, which configures the guard ring PGR.

Figure 12:
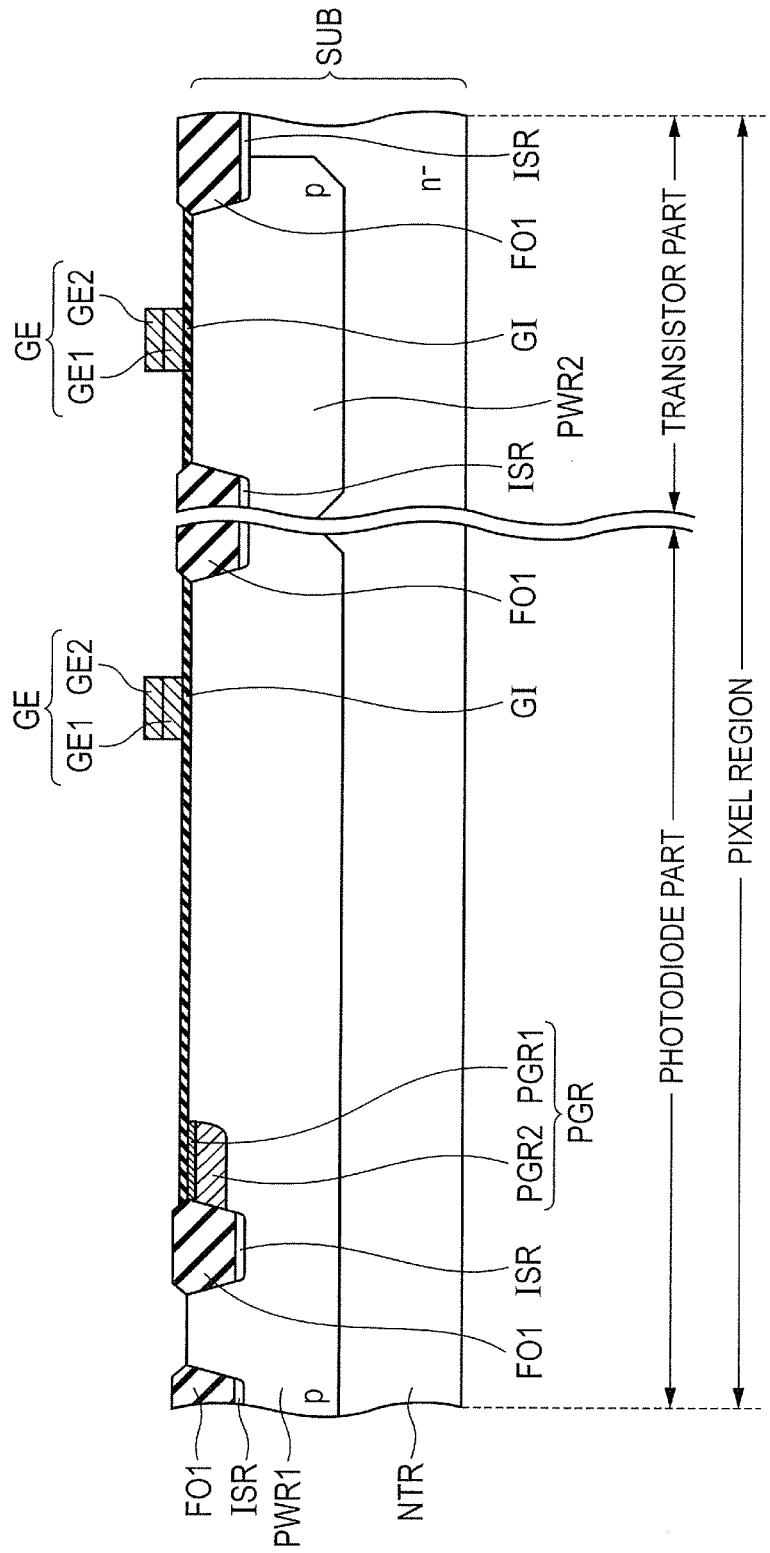
FIG. 12 is a schematic cross-sectional view showing a seventh step of the manufacturing method of the semiconductor device in the first embodiment.

Referring to FIG. 12, then, the insulating film GI serving as a gate insulating film, and the gate electrode GE are formed in a predetermined region. Specifically, the insulating film GI made of the silicon oxide film is formed over the main surface of the semiconductor substrate SUB, for example, by thermal oxidation. A polycrystalline silicon film GE1 serving as apart of the gate electrode GE, and a TEOS film GE2 formed over the upper surface of the polycrystalline silicon film GE1 and serving as another part of the gate electrode GE are formed over the gate insulating film in that order, for example, by a CVD method. Preferably, the thickness of the polycrystalline silicon film GE1 is 150 nm or more, and the thickness of the TEOS film GE2 is 50 nm or more. Thereafter, the polycrystalline silicon film GE1 and TEOS film GE2 are patterned, thereby forming the gate electrode GE of the embodiment shown in FIG. 12. In this stage, the insulating film GI is not preferably patterned.

Figure 13:
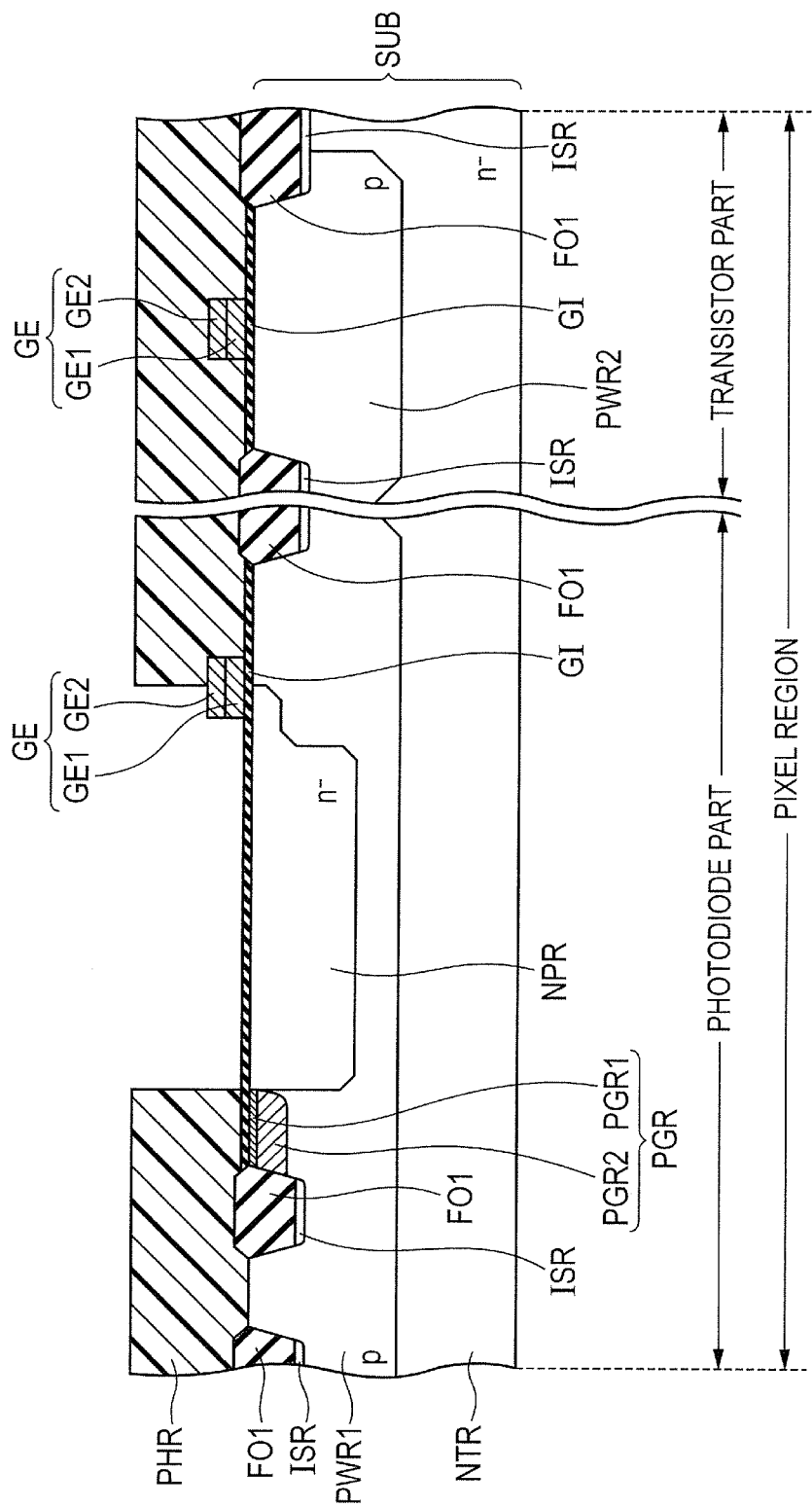
FIG. 13 is a schematic cross-sectional view showing an eighth step of the manufacturing method of the semiconductor device in the first embodiment.

Referring to FIG. 13, a pattern of the photoresist PHR is formed to have an opening in a predetermined region (for example, a region that is superimposed over the p-type well region PWR1 in the planar view) by the normal photoengraving. Then, an n-type impurity region NPR is formed inside the p-type well region PWR1 of the photodiode part using the normal ion implantation. At this time, the ion implantation is performed such that the impurity ions, such as arsenic, are preferably implanted at an implantation energy of 150 keV or more in a dose amount of $1.0 \times 10^{12}$ $cm^{-2}$ or more, and at an inclination angle of more than 0 degree (at an angle with respect to a direction vertical to the main surface of the semiconductor substrate SUB). That is, the impurity ions are implanted in the direction indicated by the arrow in FIG. 13. The photoresist PHR is removed, for example, by ashing.

Figure 14:
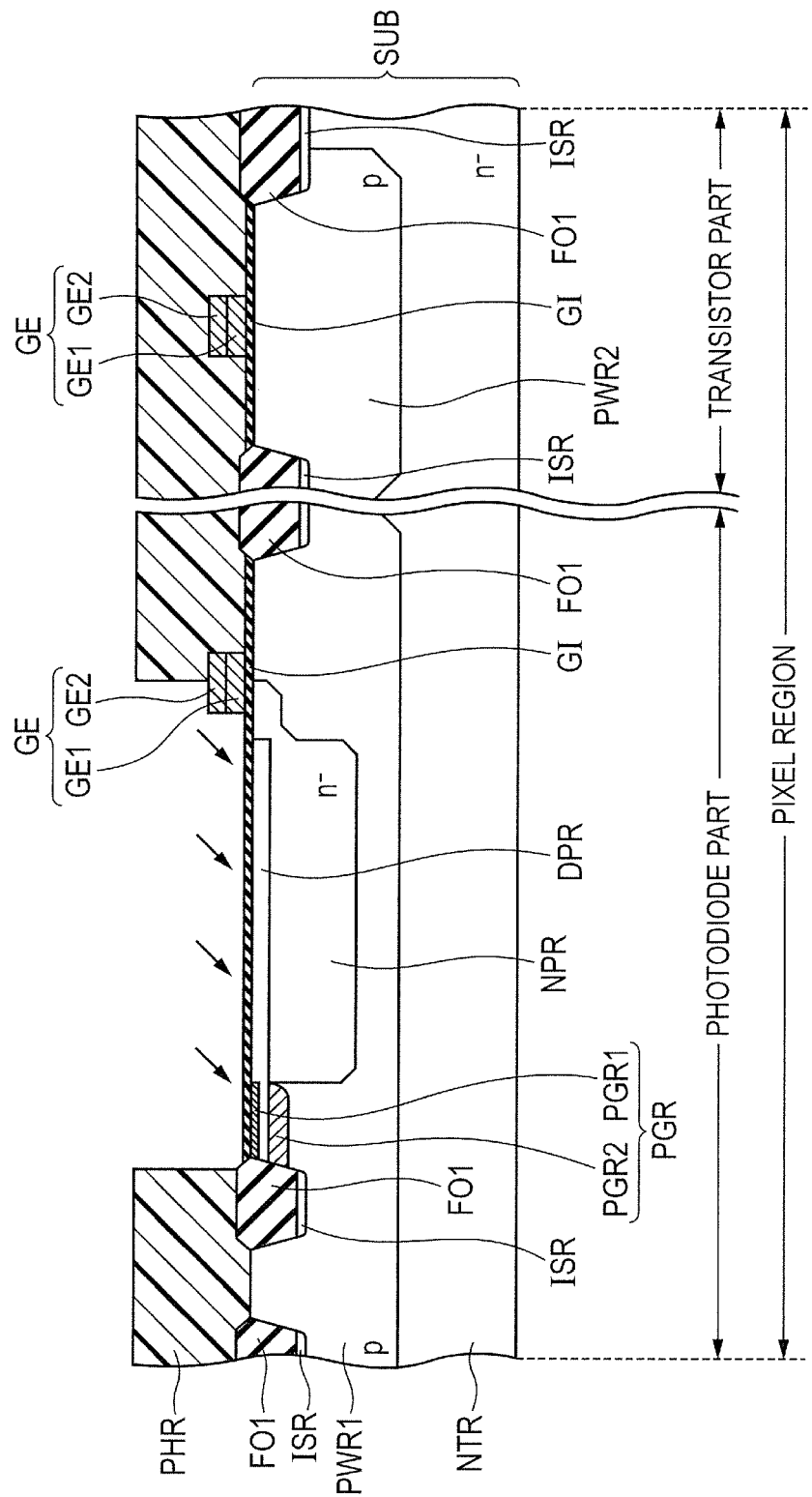
FIG. 14 is a schematic cross-sectional view showing a ninth step of the manufacturing method of the semiconductor device in the first embodiment.

Referring to FIG. 14, a pattern of the photoresist PHR is formed to have an opening in a predetermined region (for example, a region that is superimposed over the n-type impurity region NPR of the photodiode part and the guard ring PGR adjacent thereto in the planar view) by the normal photoengraving. Then, a p-type impurity region DPR is formed inside the p-type well region PWR1 and the guard ring PGR of the photodiode part using the normal ion implantation. At this time, the ion implantation is performed such that the impurity ions, such as boron, are preferably implanted at an implantation energy of 5 key or more in a dose amount of $1.0 \times 10^{13}$ $cm^{-2}$ or more, and at an inclination angle of more than 0 degree (at an angle with respect to a direction vertical to the main surface of the semiconductor substrate SUB). That is, the impurity ions are implanted in the direction indicated by the arrow in FIG. 14. The p-type impurity region DPR is preferably formed up to the region deeper than the lowermost part of the defect extension preventing layer PGR1 of the guard ring PGR disposed on the main surface side of the semiconductor substrate SUB.

As shown in FIG. 14, the p-type impurity region DPR is also formed in the guard ring PGR. Alternatively, the p-type impurity region DPR may be formed only in the n-type impurity region NPR and not in the guard ring PGR. In this case, finally, the form shown in FIG. 3 is obtained.

The photoresist PHR is removed, for example, by ashing. In this way, the photodiode PTO is formed by the p-type impurity region DPR and the n-type impurity region NPR. The photodiode PTO is formed inside the semiconductor substrate SUB on the side opposite to the field oxide film FO1 (on the right side of the guard ring PGR of FIG. 14) to sandwich the guard ring PGR between the photodiode PTO and the field oxide film FO1 over the main surface of the semiconductor substrate SUB. The photoresist PHR is removed, for example, by ashing.

Figure 15:
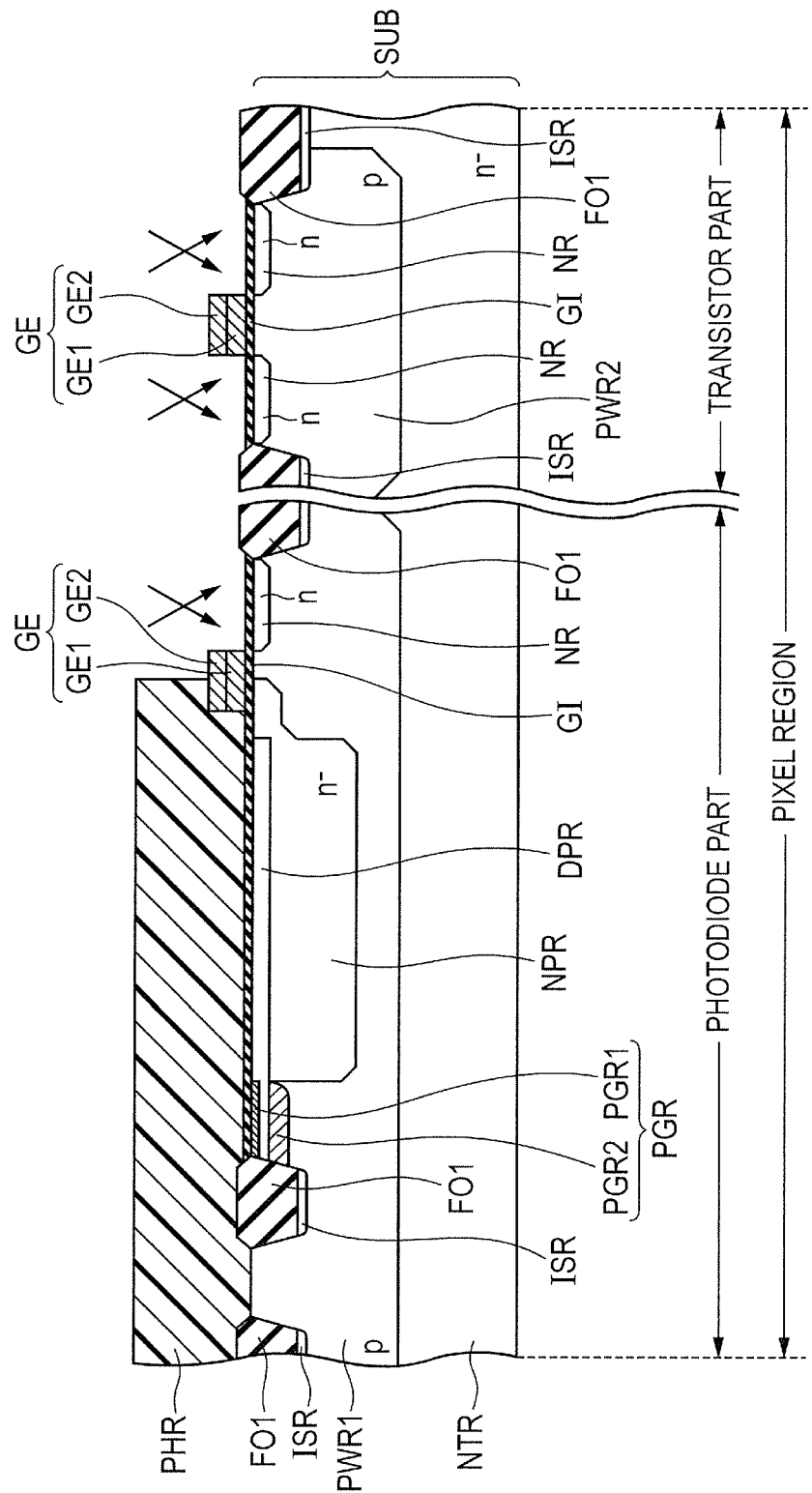
FIG. 15 is a schematic cross-sectional view showing a tenth step of the manufacturing method of the semiconductor device in the first embodiment.

Referring to FIG. 15, the n-type impurity region NR serving as the LDD is formed at the surfaces of the semiconductor substrate SUB inside the p-type well regions PWR1 and PWR2 by the normal photoengraving and ion implantation. At this time, the ion implantation is performed such that the impurity ions, such as phosphorus, are preferably implanted at an implantation energy of 50 keV or more in a dose amount of $1.0 \times 10^{13}$ $cm^{-2}$ or more, and at an inclination angle of more than 0 degree (at an angle with respect to a direction vertical to the main surface of the semiconductor substrate SUB). That is, the impurity ions are implanted in the direction indicated by the arrow in FIG. 15.

Figure 16:
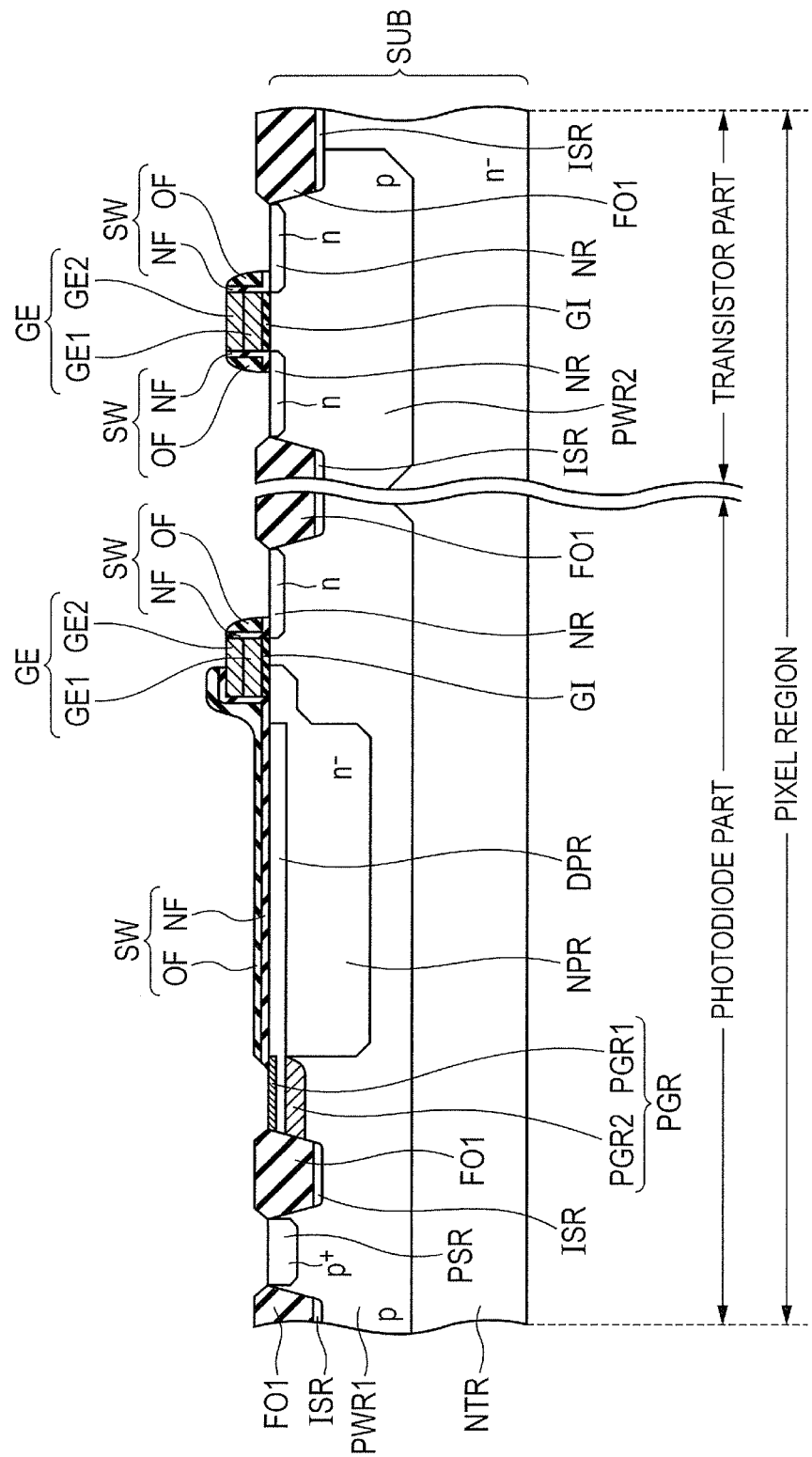
FIG. 16 is a schematic cross-sectional view showing an eleventh step of the manufacturing method of the semiconductor device in the first embodiment.

Referring to FIG. 16, first, the substrate is patterned by the normal photoengraving and etching in such a manner that the insulating film GI remains directly below the gate electrode GE and is removed in other regions, which produces the gate insulating film GI. Then, for example, a silicon nitride film NF and a silicon oxide film OF are deposited to be stacked in that order over the entire surface of the semiconductor substrate SUB. Conversely, the silicon oxide film OF and the silicon nitride film NF may be stacked in that order. For example, preferably, the thickness of the silicon nitride film NF is 45 nm, and the thickness of the silicon oxide film OF is 75 nm. Thereafter, the silicon oxide film OF and the silicon nitride film NF are patterned and etched by the normal photoengraving and etching so as to cover at least the photodiode PTO to thereby form the reflection preventing film comprised of the silicon oxide film OF and the silicon nitride film NF.

The high-concentration p-type region PSR is formed in the predetermined regions of the p-type well region PWR1 by the normal photoengraving and ion implantation.

Figure 17:
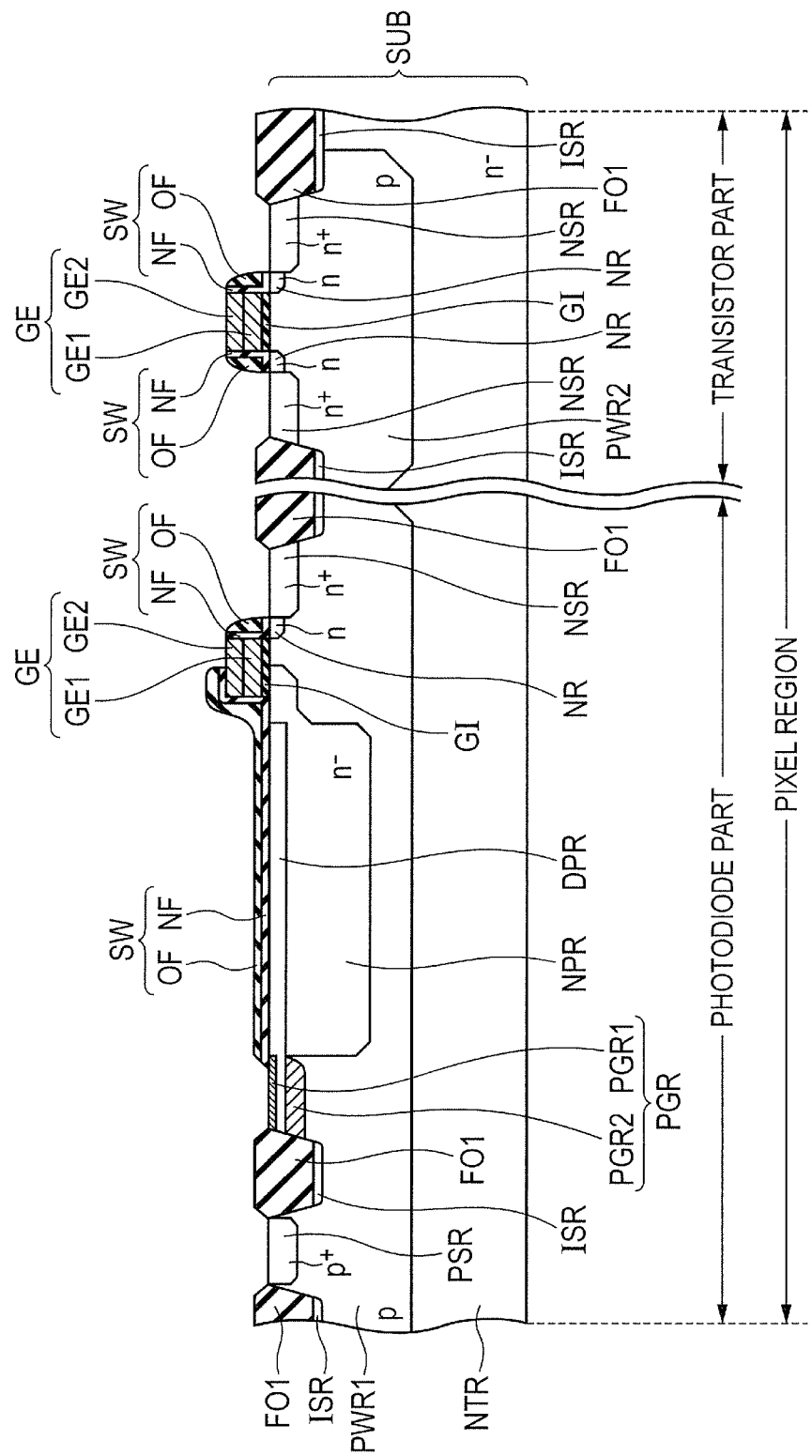
FIG. 17 is a schematic cross-sectional view showing a twelfth step of the manufacturing method of the semiconductor device in the first embodiment.

Referring to FIG. 17, the high-concentration n-type regions NSR are formed in predetermined regions of the photodiode part and transistor part by the normal photoengraving and ion implantation. Note that the high-concentration n-type region NSR is an $n^+$ region having a higher impurity concentration than that of the n-type impurity region NR. At this time, the ion implantation is performed such that the impurity ions, such as phosphorus, are preferably implanted at an implantation energy of 30 keV or more in a dose amount of $1.0 \times 10^{13}$ $cm^{-2}$ or more. Thereafter, another ion implantation is performed such that the impurity ions, such as arsenic, are preferably implanted at an implantation energy of 30 keV or more in a dose amount of $1.0 \times 10^{15}$ $cm^{-2}$ or more. In prior to the above-mentioned ion implantations, impurity ions of nitrogen may be implanted into the same region as a region where the high-concentration n-type region NSR is to be formed, at an implantation energy of 10 keV or more in a dose amount of $1.0 \times 10^{14}$ $cm^{-2}$ or more.

Figure 18:
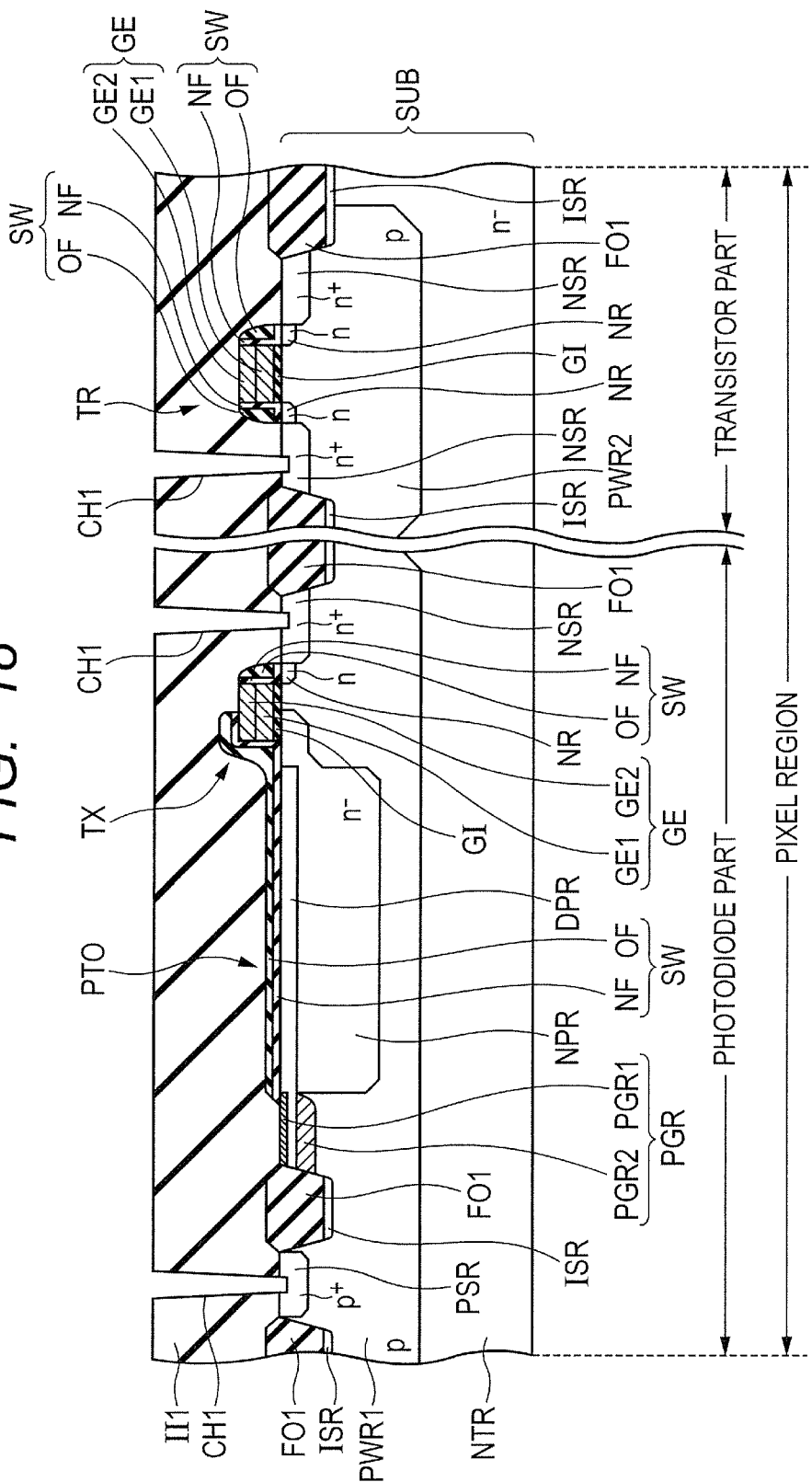
FIG. 18 is a schematic cross-sectional view showing a thirteenth step of the manufacturing method of the semiconductor device in the first embodiment.

Referring to FIG. 18, the interlayer insulating film II1 made of the silicon oxide film is formed, for example, by a chemical vapor deposition (CVD) method. Then, the interlayer insulating film II1 is polished by a chemical mechanical polishing method called CMP so as to make its upper surface flat. Further, contact holes CH1 are formed in the interlayer insulating film II1 by the normal photoengraving and etching to reach the high-concentration n-type region NSR or the high-concentration p-type region PSR.

Figure 19:
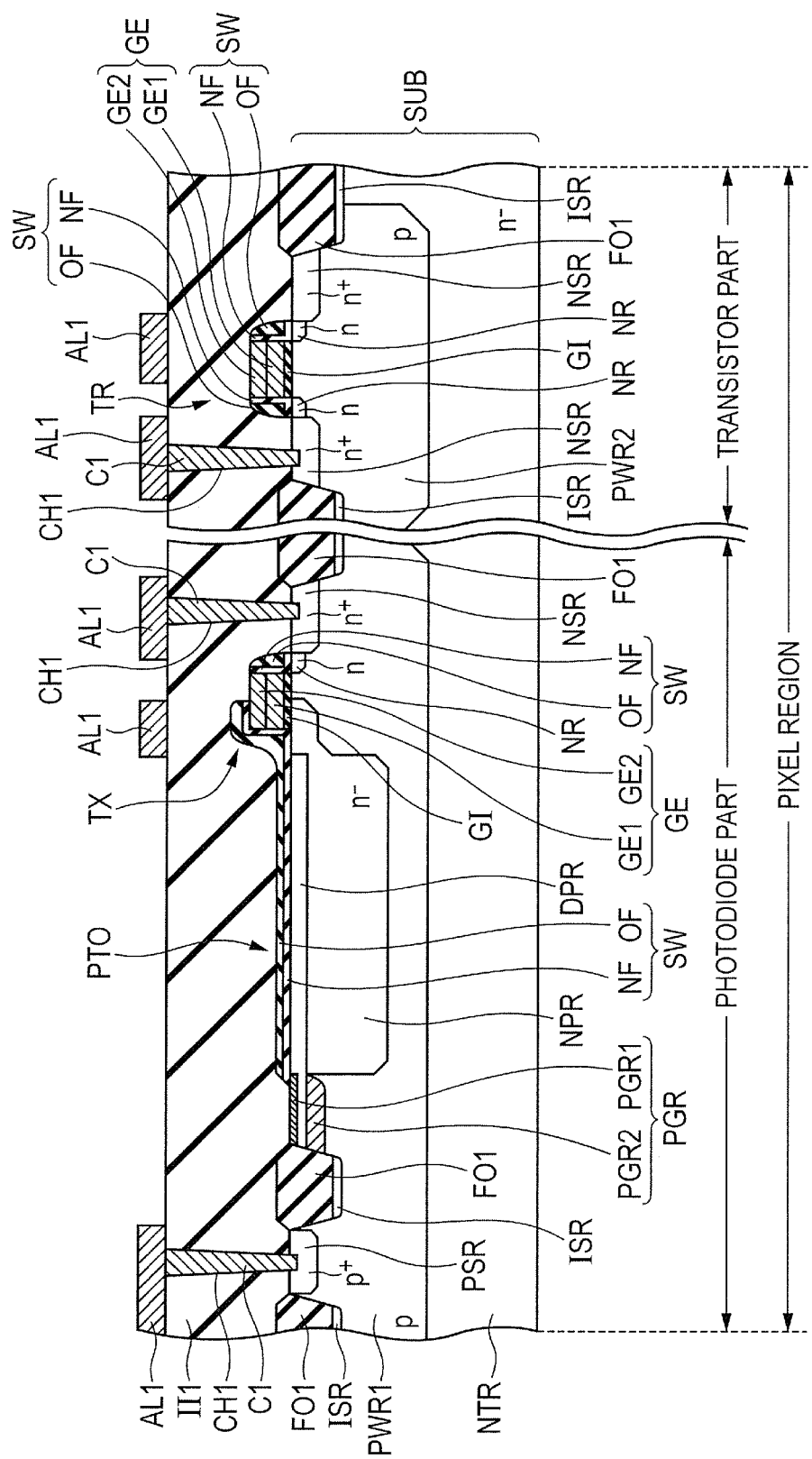
FIG. 19 is a schematic cross-sectional view showing a fourteenth step of the manufacturing method of the semiconductor device in the first embodiment.

Referring to FIG. 19, the conductive layer C1 made of, for example, tungsten fills each contact hole CH1 therewith. In the process, a thin film made of tungsten is formed over the interlayer insulating film II1, for example, by the CVD method. The tungsten thin film over the interlayer insulating film II1 is removed by the CMP. Thereafter, a thin film made of, for example, aluminum is formed over the interlayer insulating film II1 by sputtering. The metal wiring AL1 made of, for example, aluminum is formed by the normal photoengraving and etching. The metal wiring AL1 is formed to be electrically coupled to the high-concentration n-type region NSR or the high-concentration p-type region PSR through the contact C1.

Figure 20:
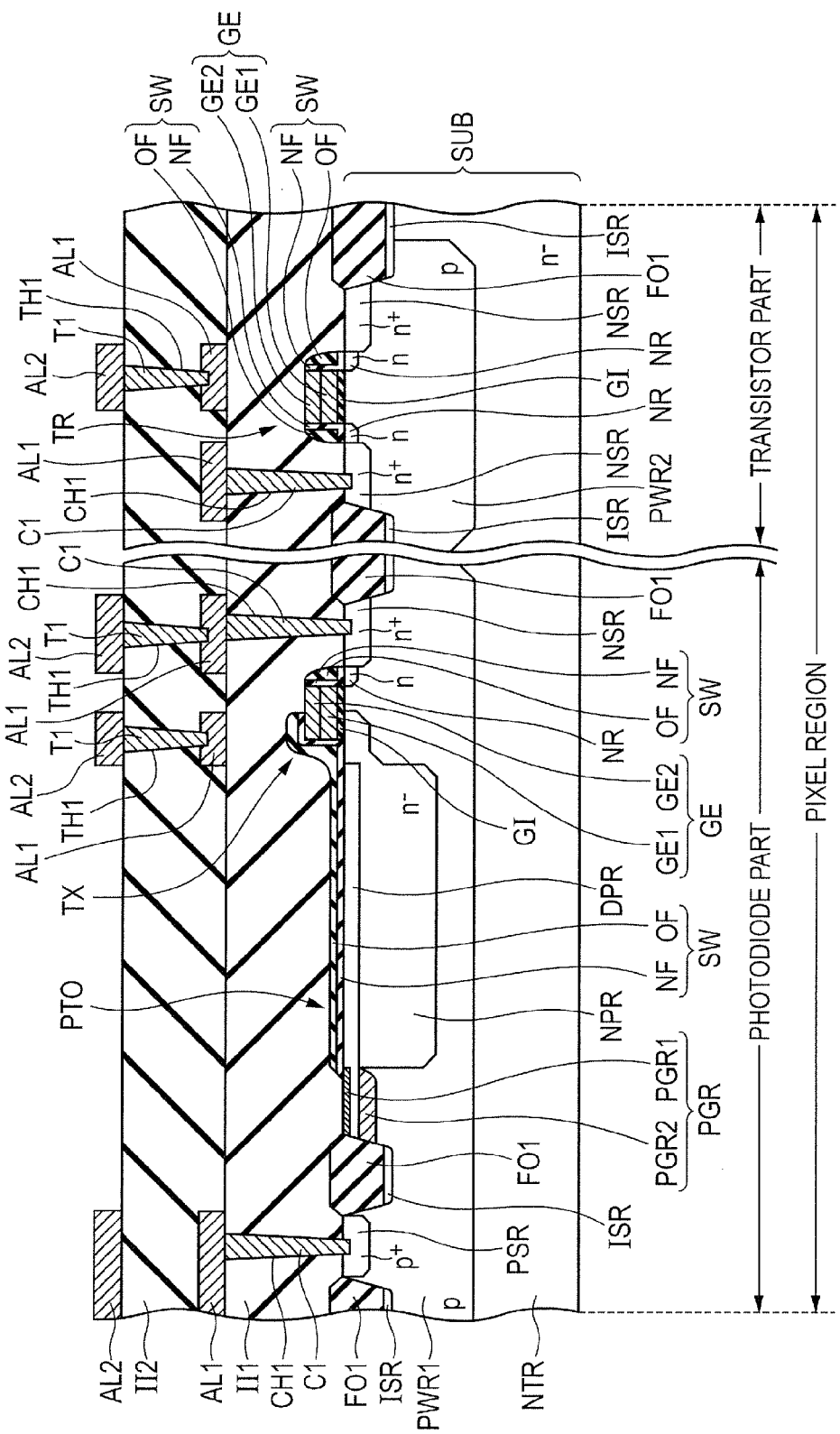
FIG. 20 is a schematic cross-sectional view showing a fifteenth step of the manufacturing method of the semiconductor device in the first embodiment.

Referring to FIG. 20, the interlayer insulating film II2 is formed over the interlayer insulating film II1 and the metal wiring AL1, and through holes TH1 are formed in desired regions (above each metal wiring AL1). The interlayer insulating film II2 and the through hole TH1 are formed in the same procedure as that for the above-mentioned interlayer insulating film II1 and the contact hole CH1. The interlayer insulating film II1 and the metal wiring AL1 have the different etching selectivity, so that the etching of the interlayer insulating film II1 progresses from the upper to lower side to be easily finished upon reaching the metal wiring AL1.

Next, the conductive layer C1 made of, for example, tungsten fills each through hole TH1 therewith. Thereafter, a pattern of the metal wiring AL2 made of, for example, aluminum is formed over the interlayer insulating film II2. The conductive layer T1 and the metal wiring AL2 are formed in the same procedure as that of the above-mentioned contact C1 and metal wiring AL1.

Figure 21:
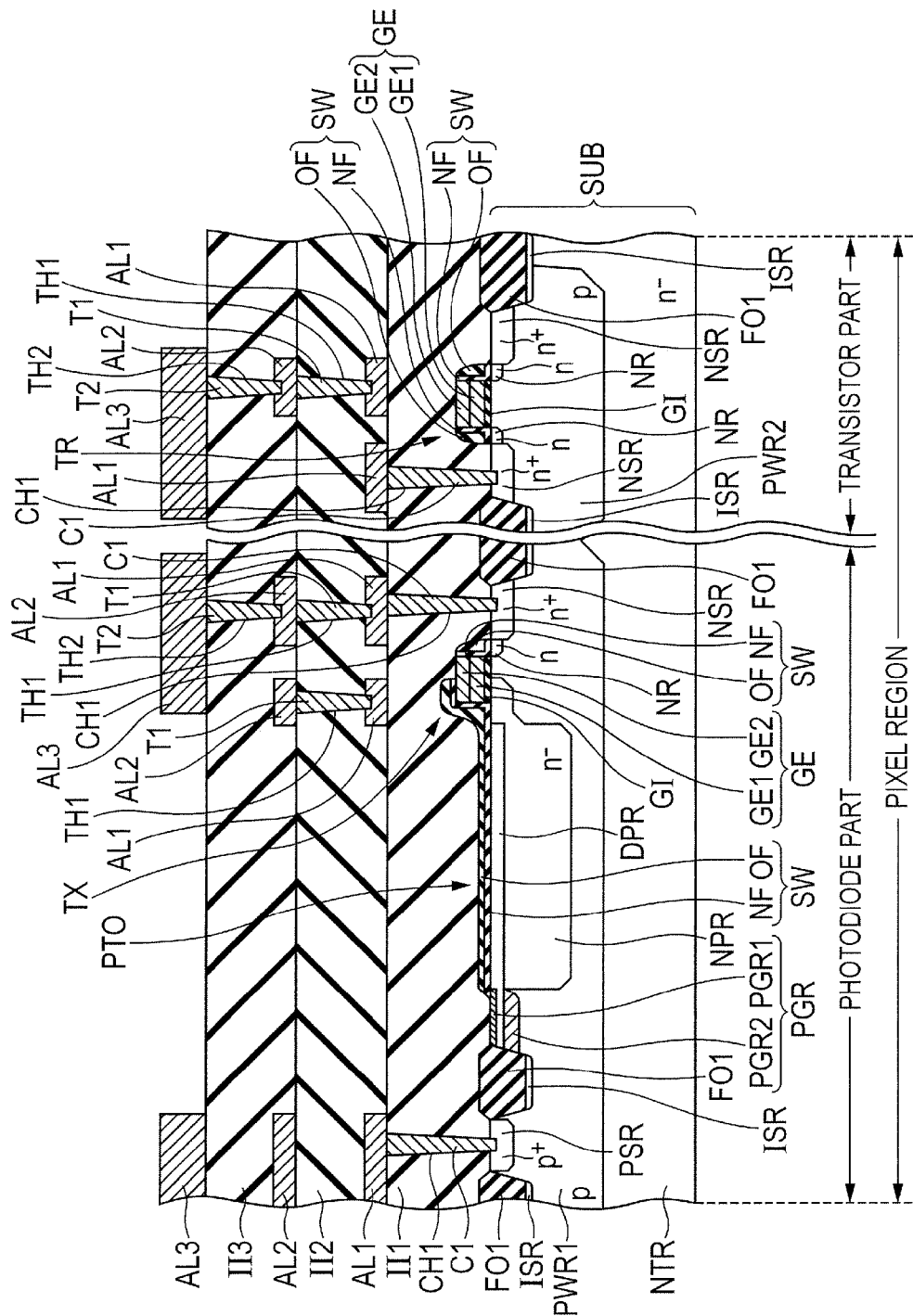
FIG. 21 is a schematic cross-sectional view showing a sixteenth step of the manufacturing method of the semiconductor device in the first embodiment.

Referring to FIG. 21, the interlayer insulating film II3 is formed over the interlayer insulating film II2 and the metal wiring AL2, and through holes TH2 are formed in desired regions (above each metal wiring AL2). The interlayer insulating film II3 and the through hole TH2 are formed in the same procedure as that for the above-mentioned interlayer insulating film II2 and the through hole TH1.

Next, a conductive film made of, for example, tungsten is formed over the interlayer insulating film II3 to fill the through holes TH2 therewith. Thereafter, the conductive film is polished and removed by the CMP to expose the upper surface of the interlayer insulating film II3. By the CMP described above, the conductive layer T2 is formed in each through hole TH2.

A metal film is formed to cover the upper surfaces of the conductive layer T2 and interlayer insulating film II3, and then patterned to form the metal wiring AL3. The metal wiring AL3, which is the uppermost wiring, is preferably formed more thickly than the metal wirings AL1 and AL2.

Figure 22:
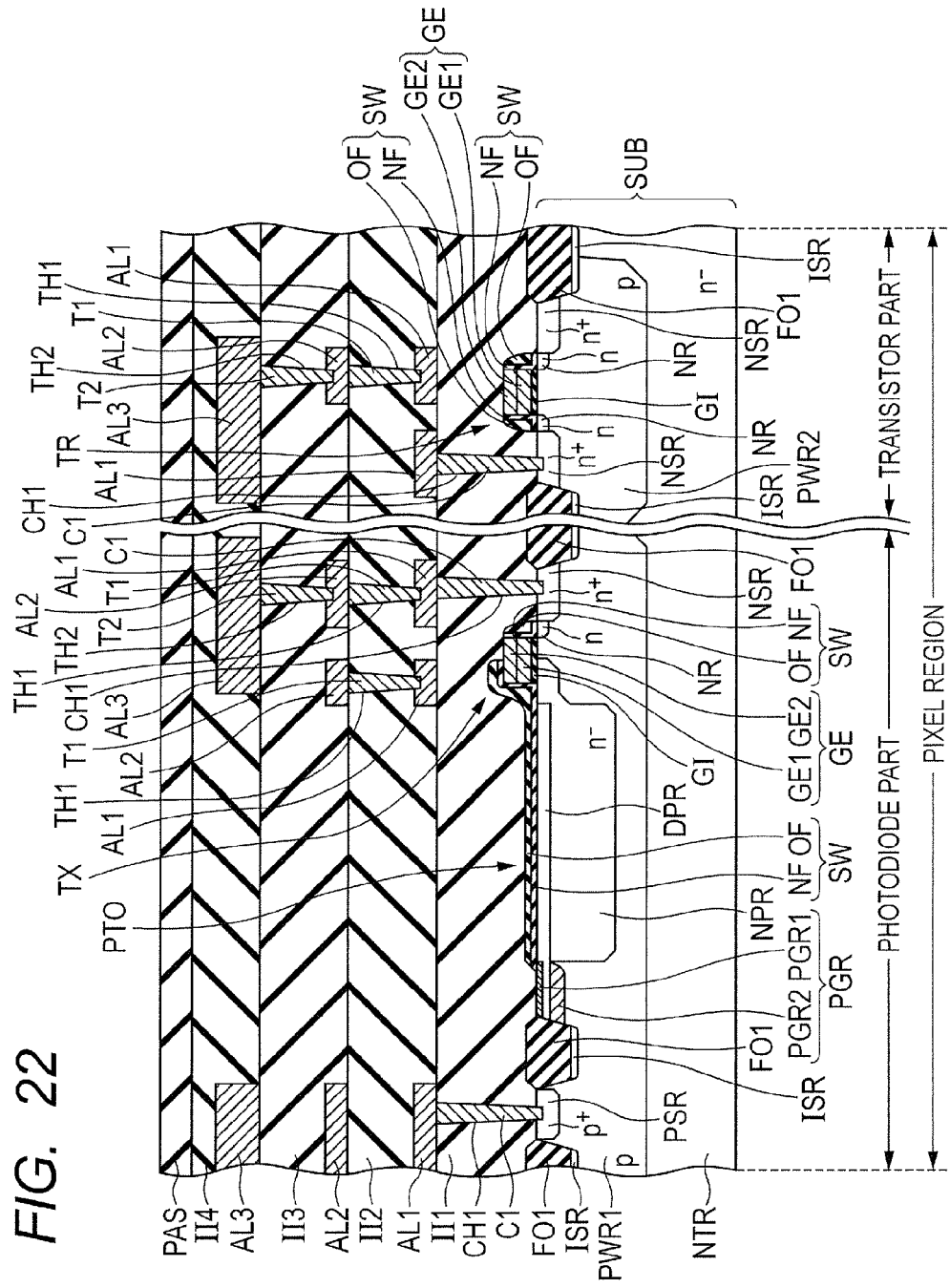
FIG. 22 is a schematic cross-sectional view showing a seventeenth step of the manufacturing method of the semiconductor device in the first embodiment.

Referring to FIG. 22, the interlayer insulating film II4 is formed over the interlayer insulating film II3 to cover the metal wiring AL3. The upper surface of the interlayer insulating film II4 is planarized, for example, by the CMP. Thereafter, a silicon nitride film is deposited over the interlayer insulating film II4, for example, by the CVD method. The silicon nitride film serves as the passivation film PAS.

Finally, the condenser lens LNS is set directly above the photodiode PTO, whereby the image sensor shown in FIG. 5 is formed.

Next, the operation and effects of this embodiment will be described with reference to comparative examples shown in FIGS. 23 and 24.

Figure 23:
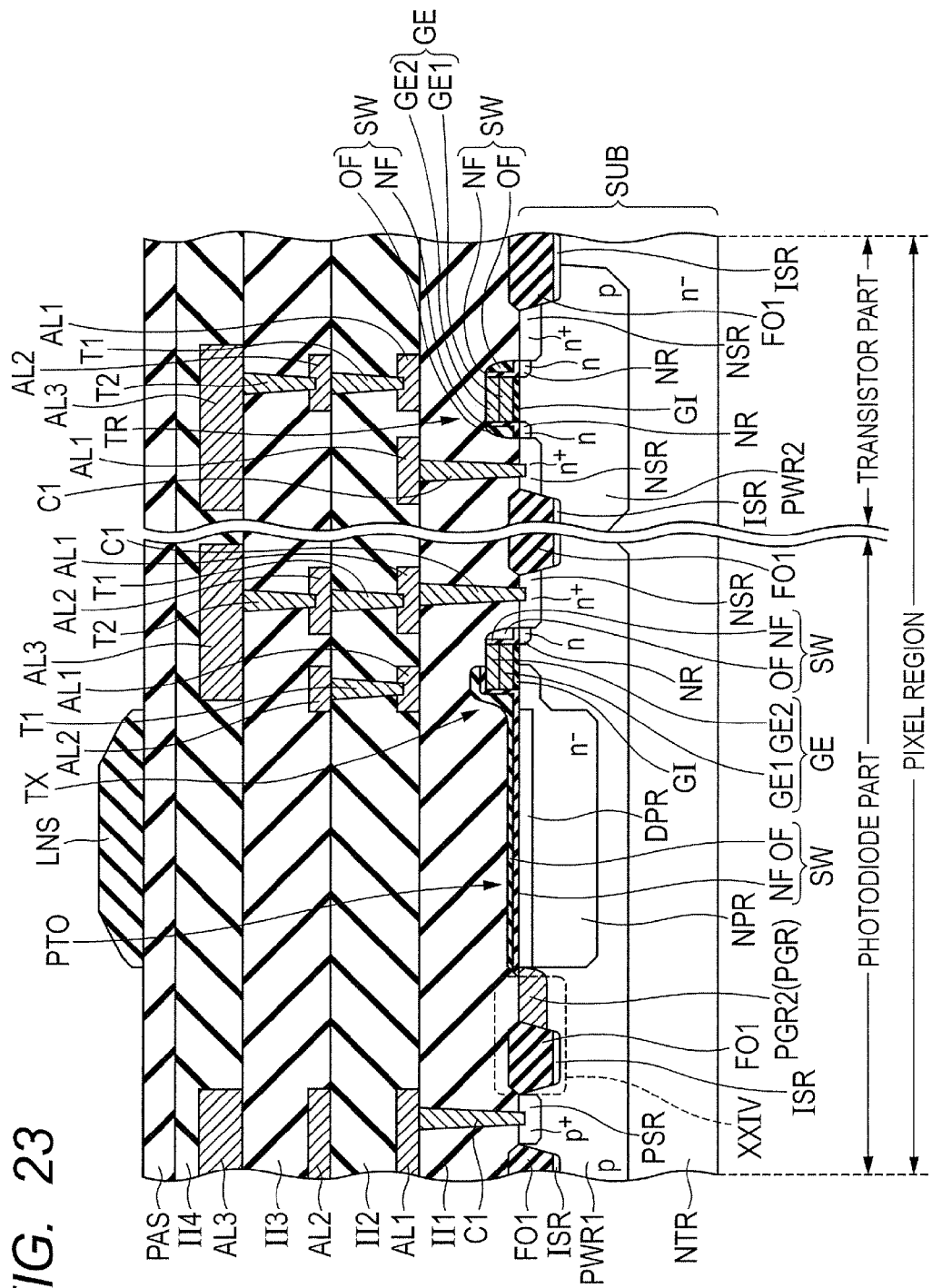
FIG. 23 is a schematic cross-sectional view showing the structure of a semiconductor device in a comparative example.

Referring to FIG. 23, a comparative example differs from this embodiment shown in FIG. 3 in that a guard ring PGR is configured of only one impurity diffusion layer PGR2 without having the defect extension preventing layer PGR1. The structure shown in FIG. 23 is basically the same as that shown in FIG. 3 in other points. The same elements are designated by the same reference numerals, and thus a description thereof will not be repeated.

Figure 24:
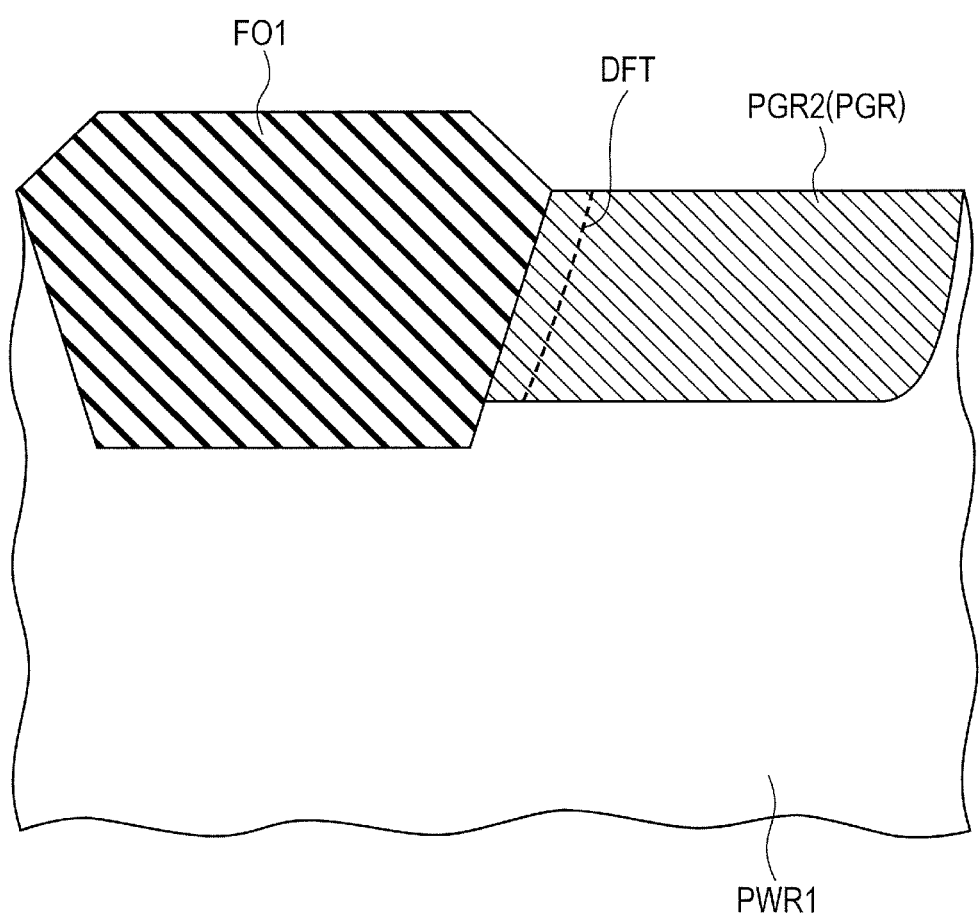
FIG. 24 is a schematic enlarged plan view of a region XXIV enclosed by a circle with a dotted line shown in FIG. 23.

Referring to FIG. 24, the guard ring PGR configured of only the impurity diffusion layer PGR2 shown in FIG. 23 is disposed between the field oxide film FO1 and the photodiode PTO. Thus, the guard ring PGR has the function of suppressing the leak current between (a pair of adjacent) photodiodes PTO included in the field oxide films FO1 (between the pair of adjacent photodiodes PTO). This is because, although the field oxide film FO1 also has the function of suppressing the leak current between the photodiodes PTO, the field oxide film FO1 happens to include a damage layer formed as not intended upon formation of the field oxide film, which generates the leak current via the damage layer.

The guard ring PGR, however, is formed by the normal ion implantation, and tends to be damaged by impact of implanted impurity ions or the like, which cannot avoid the formation of crystal defects due to the damage. The crystal defects formed in the guard ring PGR tends to extend within the guard ring PGR due to a peripheral stress to generate dislocation defects. The formation of the dislocation defects can induce inconveniences, such as reducing the reliability of the image sensor, which would include false recognition of data on pixel signals in the pixel regions as an image defect DFT.

As the concentration of ion implantation for forming the guard ring PGR becomes higher, the possibility of the crystal defects that can cause the pixel defect DFT is increased to a higher level, and as a result, the above-mentioned inconveniences due to the pixel defect DFT tends to easily happen. However, the concentration of the guard ring PGR is made lower, which can decrease the possibility of generation of the crystal defects, leading to reduce the possibility of generation of the pixel defects DFT, and can also degrade the function of suppressing the leak current of the guard ring PGR.

Figure 25:
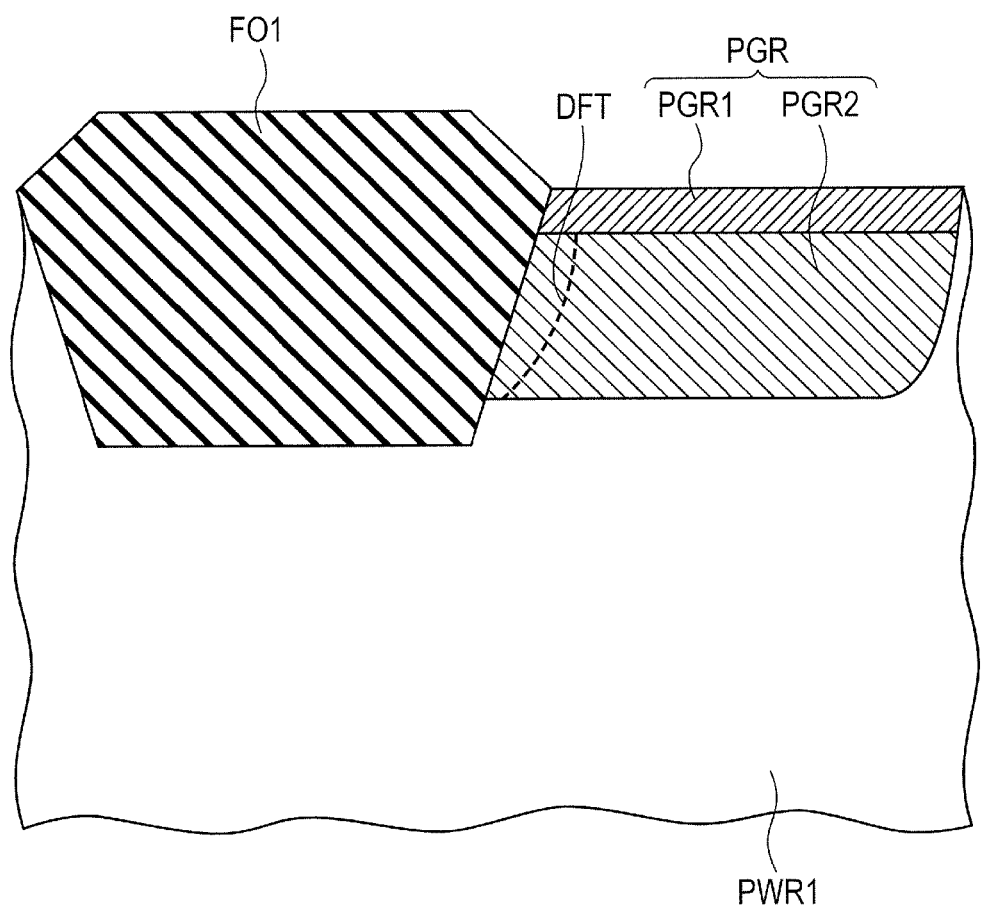
FIG. 25 is a schematic enlarged plan view showing the structure obtained by replacing a guard ring and a pixel defect of FIG. 24 indicative of the comparative example with a guard ring and a pixel defect of the first embodiment.

In this way, as shown in FIG. 25, the guard ring PGR of this embodiment has the defect extension preventing layer PGR1. The defect extension preventing layer PGR1 is a region that is generated by implantation of neutral impurity ions without any polarity, such as nitrogen, in formation of the preventing layer, causing the breakage of a silicon crystal structure in a region of the existing semiconductor substrate SUB where the ions are implanted, leading to transformation of the region into an amorphous structure, and then recrystallization thereof. Thus, the defect extension preventing layer PGR1 and the impurity diffusion layer PGR2 completely differ from each other in crystal structure.

Thus, after the region with the defect extension preventing layer PGR1 formed therein is transformed into the amorphous structure, the high-concentration impurity diffusion layer PGR2 is formed. Even though the impurity diffusion layer PGR2 generates a number of pixel defects DFT from many crystal defects, the progress of the pixel defects DFT stops at the boundary between the defect extension preventing layer PGR1 and the impurity diffusion layer PGR2 which form the twin. That is, the pixel defect DFT extends to reduce the possibility of reaching the uppermost surface of the guard rings PGR (defect extension preventing layer PGR1).

Even though there is a pixel defect DFT not reaching the surface, the possibility of false recognition of a pixel signal can be reduced. The defect extension preventing layer PGR1 contains the neutral impurity ions with no polarity that are implanted thereinto, so that there occurs no defect degrading the reliability of the image in the crystal structure. Thus, this embodiment reduces the necessity of suppressing the formation of the image defect DFT, and thus can provide the guard ring PGR with the high reliability of the image signal that can effectively suppress the leak current even at a high concentration of impurities. That is, the tradeoff between the measures against the crystal defect and the measures against the leak current in the guard ring is wiped out, and both the measures can be carried out to provide the semiconductor device for an image sensor with higher reliability.

The defect extension preventing layer PGR1 extends from the surface of the semiconductor substrate SUB to the depth of 40 nm or more in the direction vertical to the surface, so that the defect extension preventing layer PGR1 enhances the effect of suppressing the extension of the pixel defect DFT.

The defect extension preventing layer PGR1 is formed on the side of the main surface of the semiconductor substrate SUB with respect to the impurity diffusion layer PGR2, which can enhance the effect of suppressing the inconveniences, including false recognition of data on the image signal in the image region, particularly, due to the extension of the pixel defect DFT to the surface of the semiconductor substrate SUB.

Note that in forming the guard ring PGR, the ion implantation of nitrogen for the defect extension preventing layer PGR1 is first performed, and then the ion implantation of boron for the impurity diffusion layer PGR2 is performed, which can smoothly transform the region with the defect extension preventing layer PGR1 into the amorphous structure.

Second Embodiment

First, an image sensor of this embodiment, particularly, the structure of a pixel region of the image sensor will be described below using FIG. 26.

Figure 26:
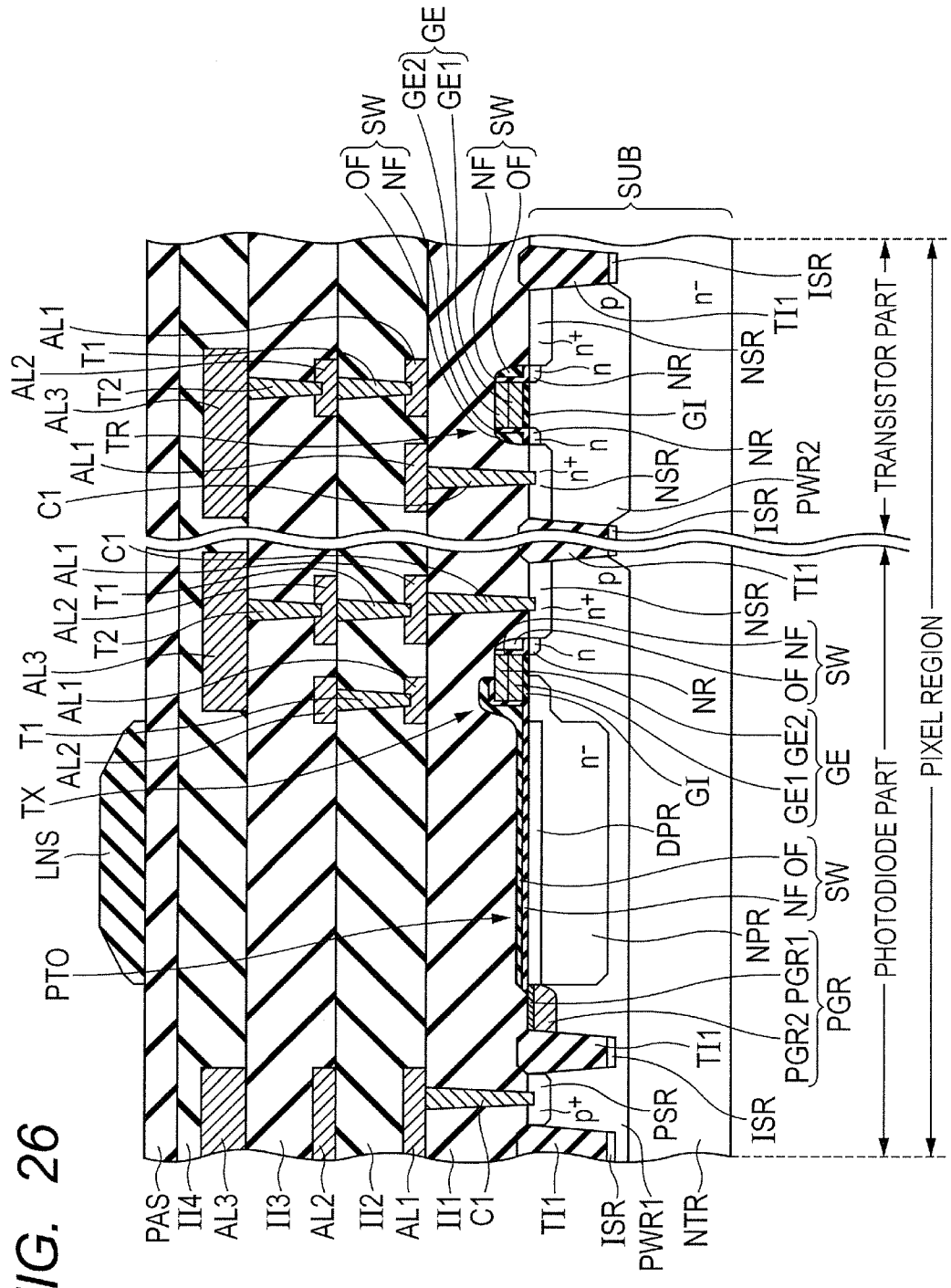
FIG. 26 is a schematic cross-sectional view showing an example of the structure of a semiconductor device according to a second embodiment of the invention.

Referring to FIG. 26, the image sensor of this embodiment differs from the image sensor of the first embodiment shown in FIG. 3 in that a STI oxide film TI1 is formed as a first isolation insulating film that performs electrical isolation between the photodiode part and the transistor part, as well as electrical isolation inside the photodiode, instead of the field oxide film FO1. The structure in FIG. 26 is basically the same as that shown in FIG. 3 in other points. The same elements are designated by the same reference numerals, and thus a description thereof will not be repeated.

The STI oxide film TI1 is an oxide film formed by using the so-called shallow trench isolation (STI) method as will be described later. Specifically, the STI oxide film TI1 is made of an insulating film, for example, a silicon oxide film that is embedded in a trench formed in the semiconductor substrate SUB from the main surface of the semiconductor substrate SUB. The STI oxide film TI1 serves to electrically isolate a pair of adjacent photodiodes PTO from each other, like the field oxide film FO1. The trench is supposed to be narrow and deep as compared to the concave portion CV1 generally formed upon forming the field oxide film FO1 in the first embodiment. The side surface of the trench extends at an angle closer to the direction vertical to the main surface of the semiconductor substrate SUB than the side surface of the concave portion CV1.

As shown in FIG. 26, the side surface of the STI oxide film TI1 is slightly inclined with respect to the direction vertical to the main surface of the semiconductor substrate SUB. The width of a lower part of the STI oxide film TI1 is narrower than that of an upper part thereof. However, the STI oxide film is not limited to this form. Alternatively, the STI oxide film TI1 may have its side surface extending in the direction vertical to the main surface of the semiconductor substrate SUB and may have a constant width. The STI oxide film TI1 shown in FIG. 26 has its uppermost surface protruding upward in the figure with respect to the main surface of the semiconductor substrate SUB. The STI oxide film is not limited to this form. Alternatively, for example, the uppermost surface of the STI oxide film may be flush with the main surface of the semiconductor substrate SUB.

A region outside (directly under) the STI oxide film TI1 in contact with the bottom surface of the STI oxide film TI1 has the p-type isolation region ISR, which is similar to the p-type isolation region ISR in contact with the bottom surface of the field oxide film FO1.

Now, a manufacturing method of the semiconductor device for an image sensor of this embodiment, specifically, a manufacturing method of the STI oxide film TI1 shown in FIG. 26, will be described with reference to FIGS. 27 to 30.

Figure 27:
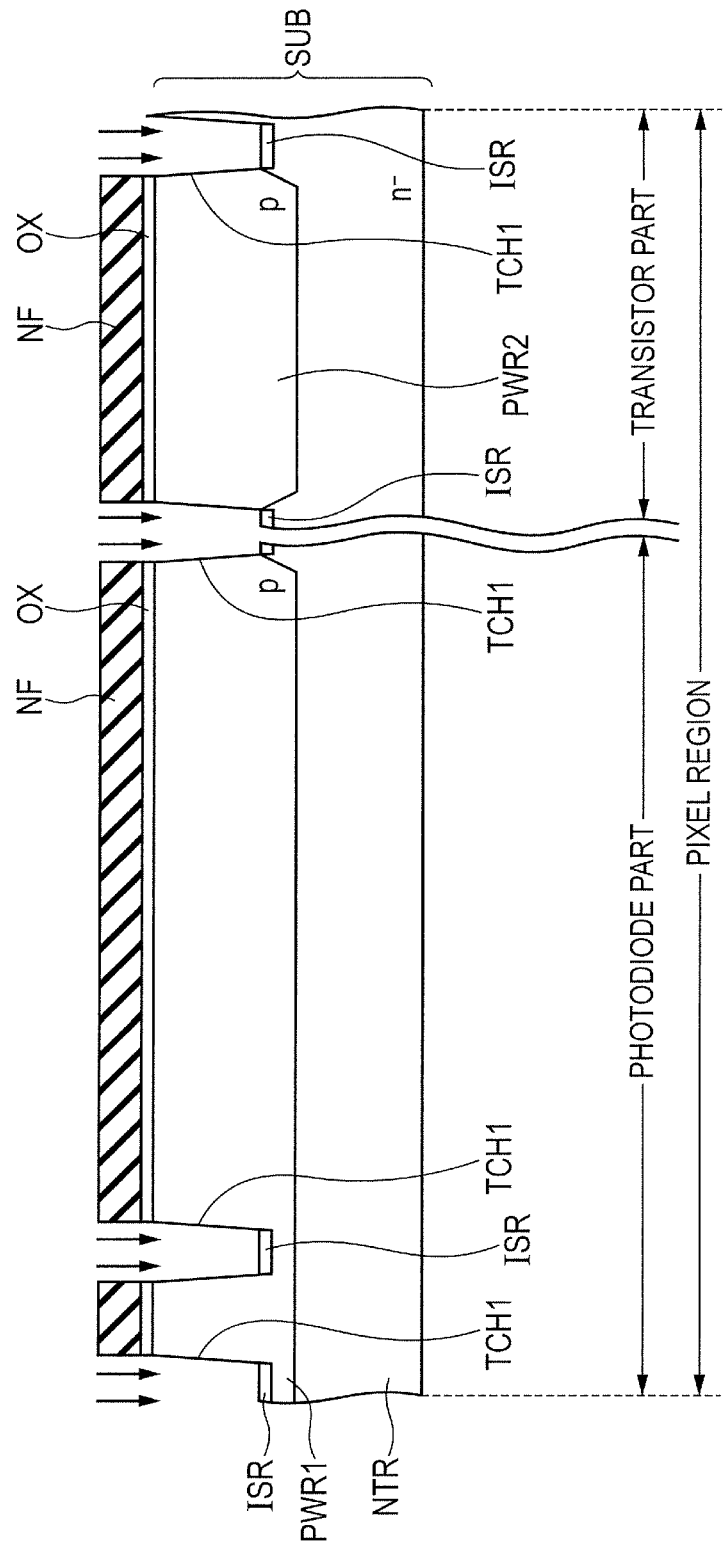
FIG. 27 is a schematic cross-sectional view showing a first step of the manufacturing method of the semiconductor device in the second embodiment.

Referring to FIG. 27, the semiconductor substrate is subjected to the same procedure as that of steps shown in FIGS. 6 and 7 of the first embodiment. After removing the photoresist PHR, the concave portion CV1 is etched by the normal etching using the pattern of the silicon nitride film NF as a mask so as to be further deeper and to have its side surface closer to the direction vertical to the main surface of the semiconductor substrate SUB. In this way, the trench TCH1 is formed from the main surface of the semiconductor substrate SUB therein.

Next, like the step of FIG. 8, impurity ions, such as boron, are implanted into the region outside (directly under) the trench TCH1 in contact with the bottom surface of the trench TCH1 by the normal ion implantation, whereby the p-type isolation region ISR is formed as the diffusion region for isolation.

Figure 28:
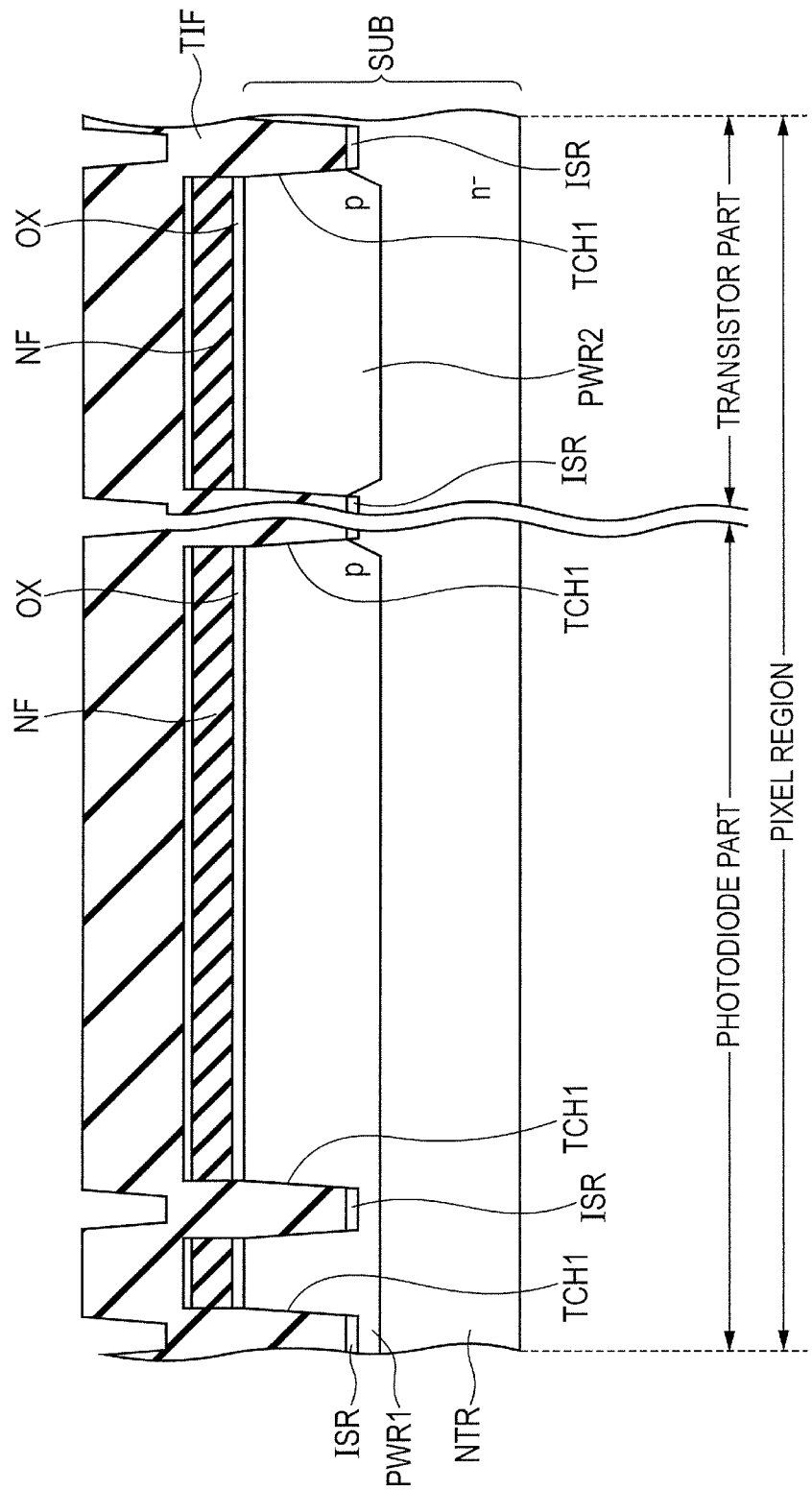
FIG. 28 is a schematic cross-sectional view showing a second step of the manufacturing method of the semiconductor device in the second embodiment.

Referring to FIG. 28, for example, the silicon oxide film TIF is deposited over the pattern of the silicon nitride film NF by the CVD method so as to fill the trench TCH1 therewith. At this time, the thickness of the silicon oxide film TIF is preferably equal to or more than 400 nm.

Figure 29:
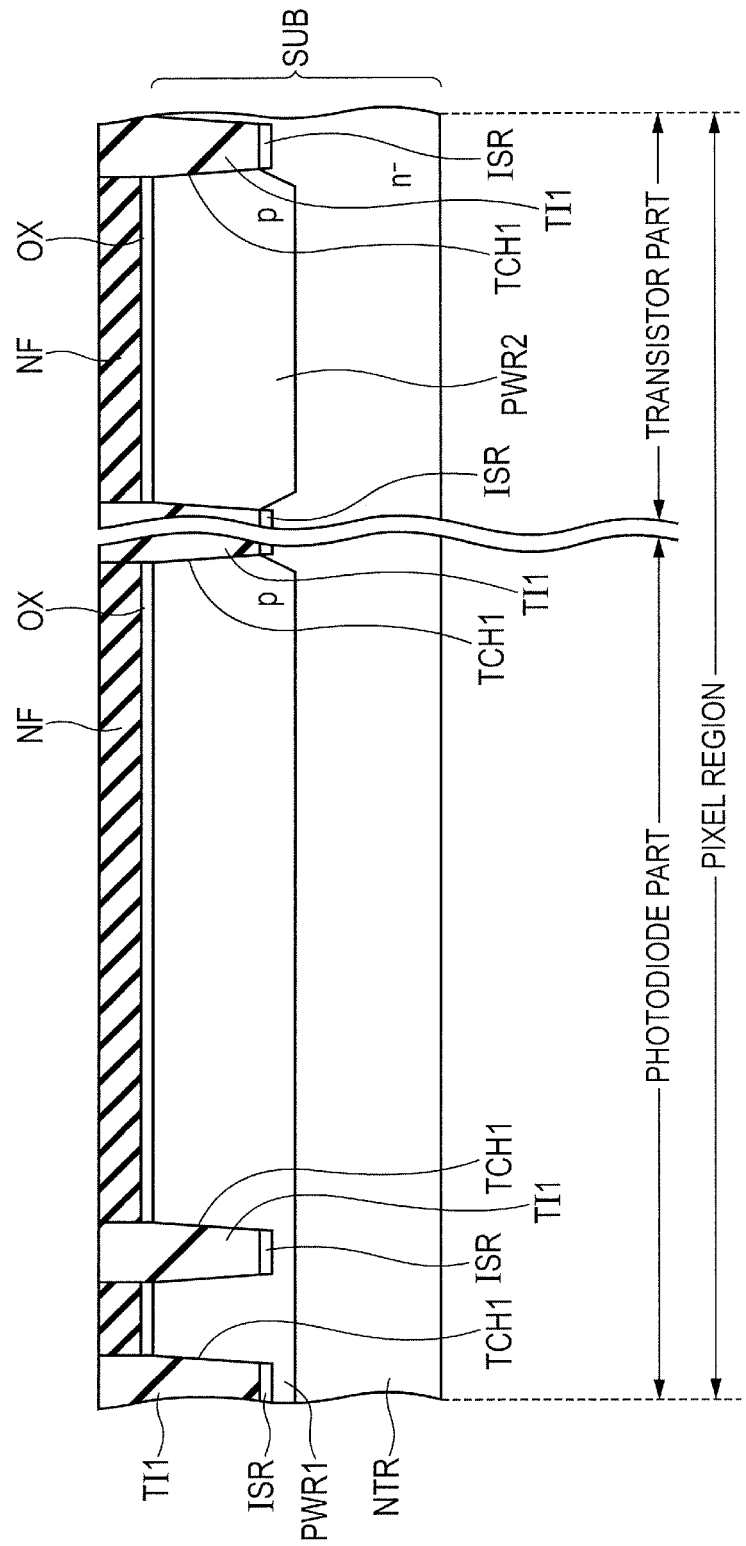
FIG. 29 is a schematic cross-sectional view showing a third step of the manufacturing method of the semiconductor device in the second embodiment.

Referring to FIG. 29, the silicon oxide film TIF is polished by the CMP to expose the upper surface of the silicon nitride film NF, whereby the silicon oxide film TIF is formed to remain only in the trench TCH1. The silicon oxide film TIF remaining in the trench TCH is the STI oxide film TI1. The STI oxide film TI1 has its uppermost surface flattened to be flush with the uppermost surface of the silicon nitride film NT.

Figure 30:
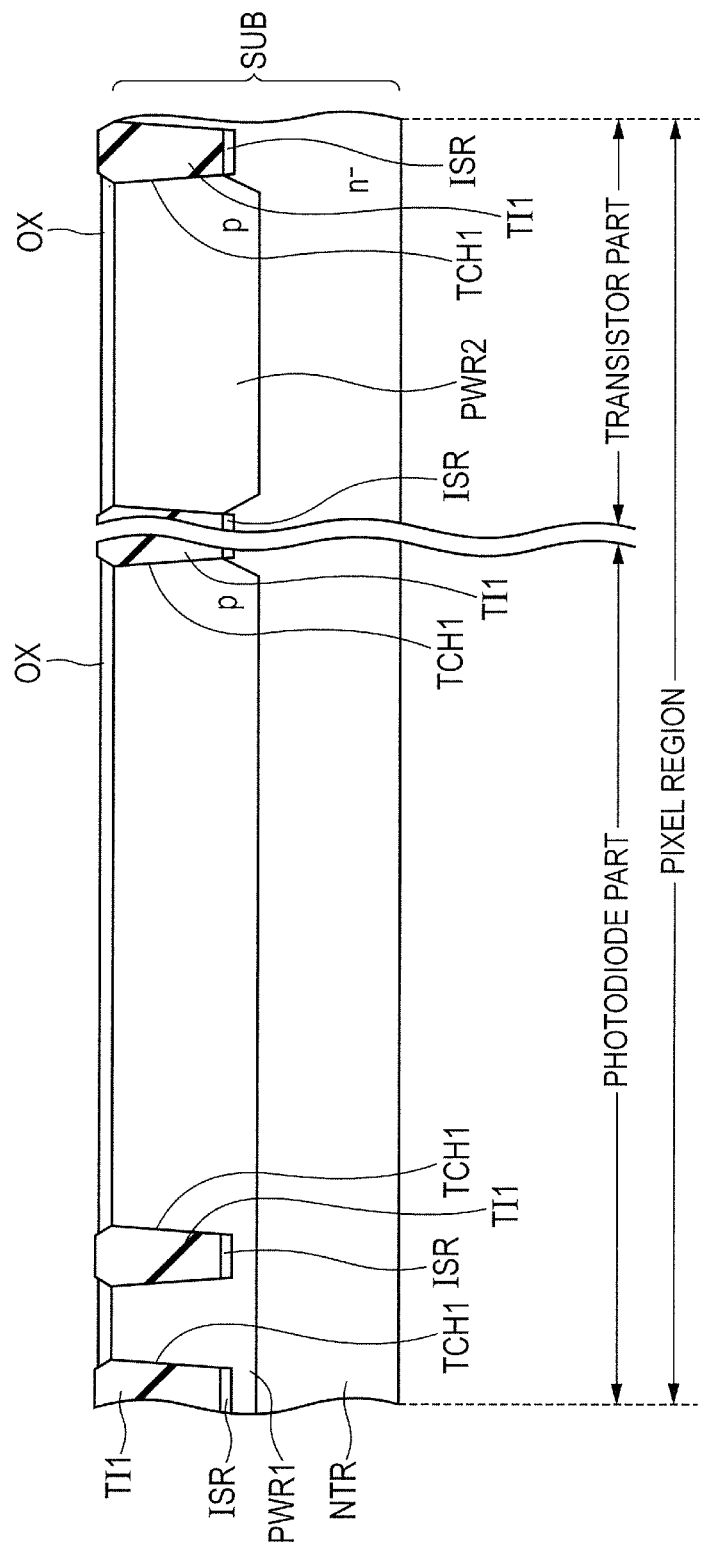
FIG. 30 is a schematic cross-sectional view showing a fourth step of the manufacturing method of the semiconductor device in the second embodiment.

Referring to FIG. 30, the silicon nitride film NF is removed by the normal photoengraving and etching. As mentioned above, the STI oxide film TI1 is formed by the so-called STI method.

Thereafter, the processes that are basically the same as those in steps shown in FIGS. 10 to 22 are performed to form an image sensor shown in FIG. 26. Note that after removal of the silicon oxide film OX shown in FIG. 30, the processes that are basically the same as those of steps shown in FIGS. 10 to 22 may be carried out.

Next, the effects of the preferred embodiment of the invention will be described. In this embodiment, the image sensor includes the STI oxide film TI1 as the first isolation insulating film, instead of the field oxide film FO1 of the first embodiment. In the image sensor, a guard ring PGR is formed between the STI oxide film and the photodiode PTO. The guard ring PGR includes the defect extension preventing layer PGR1. This embodiment also has the operation and effect of suppressing extension of the pixel defects DFT, like the first embodiment.

Although not described above, the inner wall on the bottom side of the trench TCH1 formed by the STI method is oxidized in advance to form a thin inner wall oxide film, followed by formation of the silicon oxide film TIF occupying a main body of the STI oxide film TI1. In this case, the crystal defects formed in formation of the inner wall oxide film extends as the dislocation defect due to the stress generated in the trench TCH1, and could be developed to the pixel defects DFT (see FIG. 24). The defect extension preventing layer PGR1 of the guard ring PGR formed adjacent to the STI oxide film TI1 also has the effect of suppressing the extension of the pixel defects DFT from such an inner wall oxide film. In particular, when the STI oxide film TI1 with the inner wall oxide film is formed, the guard ring PGR with the defect extension preventing layer PGR1 is advantageously formed.

Third Embodiment

Although in the first embodiment, only the structure of the pixel region has been described, actually, a peripheral circuit region (corresponding to the peripheral circuit region PCT of FIG. 2) is formed in addition to the pixel region as described above. Here, the structure of a semiconductor device including the peripheral circuit region will be described using FIG. 31.

Figure 31:
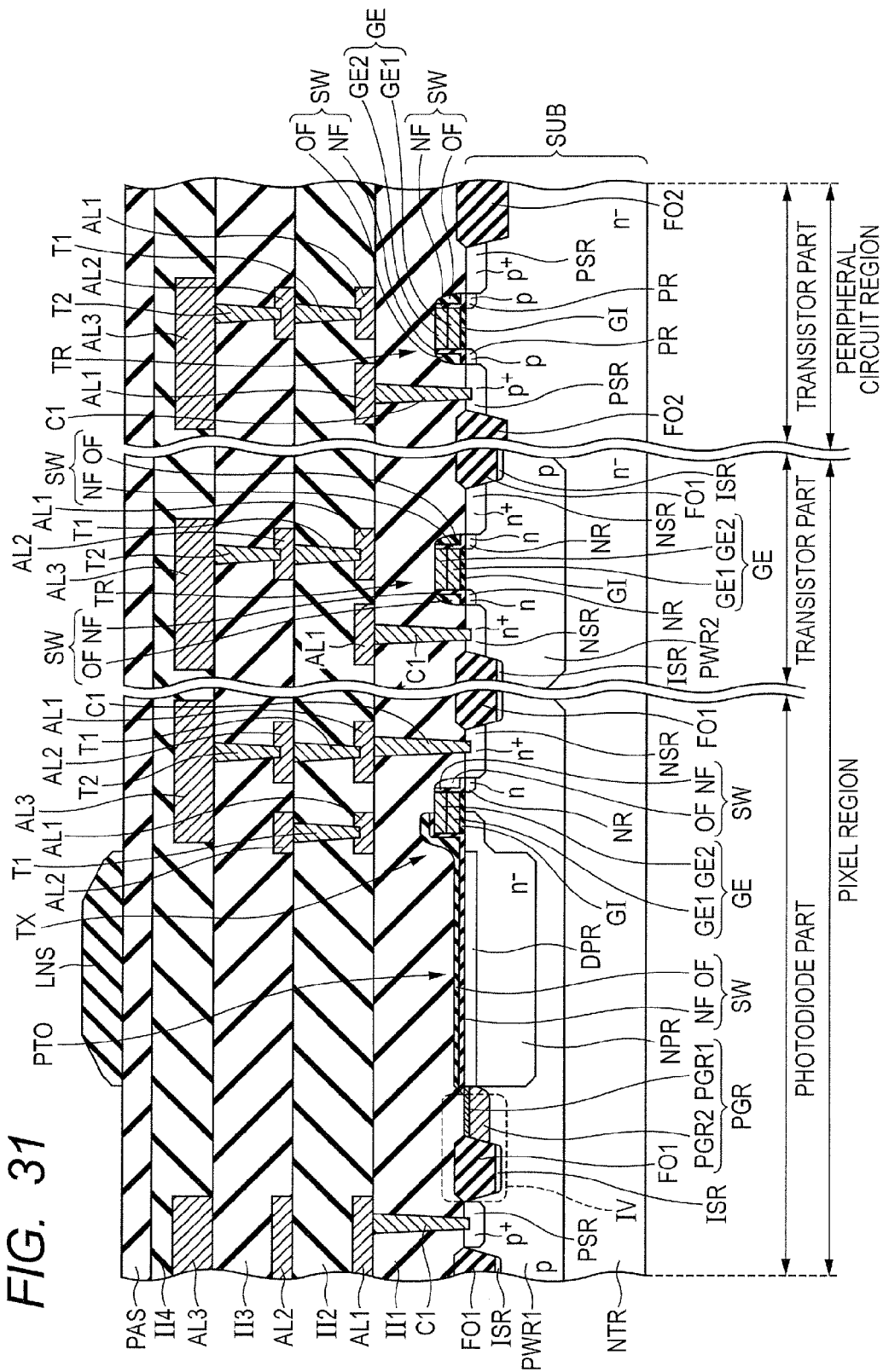
FIG. 31 is a schematic cross-sectional view showing an example of the structure of a semiconductor device according to a third embodiment of the invention.

Referring to FIG. 31, in the image sensor of this embodiment, the structure of the pixel region is the same as that in the image sensor of the first embodiment shown in FIG. 3. Specifically, the structure of the pixel region includes the photodiode PTO, the guard ring PGR, and the field oxide film FO1 as the first isolation insulating film.

Like the pixel region, n⁻regions comprised of an n⁻epitaxial growth layer are formed in the peripheral circuit region of this embodiment. The peripheral circuit region is also provided with the same type of transistor part as that in the pixel region. The surface (inside the semiconductor substrate SUB) of the semiconductor substrate SUB (n⁻region) in the transistor part of the peripheral circuit region is provided with a transistor TR for control. The transistor TR for control is a semiconductor element for controlling the photodiode, like the transistor TR for control in the transistor part of the pixel region, and for inputting and outputting an electric signal between the inside and outside of the pixel region.

Specifically, the transistor TR for control (MIS transistor TR) in the peripheral circuit region includes a pair of p-type source and drain regions PR and PSR, the gate insulating film GI, and a gate electrode GE. The pair of p-type source and drain regions PR and PSR are respectively formed at the surface of the semiconductor substrate SUB with a spacing therebetween. The pair of p-type source and drain regions PR and PSR respectively includes a high-concentration p-type region PSR as the high-concentration region, and a p-type impurity region PR as the LDD.

The gate electrode GE is formed over the surface of the semiconductor substrate SUB between the pair of p-type source and drain regions PR and PSR via the gate insulating film GI. The structure of this region and the structure of the sidewall insulating layer are the same as those of the transistor TR for control in the transistor part.

In the peripheral circuit region, a field oxide film FO2 (second isolation insulating film) is formed around the transistor TR for control at the surface of the semiconductor substrate SUB.

The field oxide film FO2 is a LOCOS oxide film, which is the same as the field oxide film FO1, but is formed more deeply than the field oxide film FO1. Thus, the field oxide film FO2 enhances the function of, for example, electrically isolating the pair of adjacent photodiodes PTO from each other as compared to the field oxide film FO1. A p-type isolation region ISR having the function of reinforcing the element isolation may not be formed directly under the bottom surface of the field oxide film FO2. However, the p-type isolation region may be formed directly under the bottom surface of the field oxide film FO2.

Also in the transistor part of the peripheral circuit region, like the transistor part of the pixel region, the interlayer insulating film II1 is formed over the surface of the semiconductor substrate SUB to cover the MIS transistor TR. This is formed as the same layer as the interlayer insulating film II1 of the pixel region (the same goes for each upper layer). The metal wiring AL1, the interlayer insulating film II2, the conductive layer T1, the metal wiring AL2, the interlayer insulating film II3, the conductive layer T2, the metal wiring AL3, the interlayer insulating film II4, and the passivation film PAS are formed over the interlayer insulating film II1 of the transistor part in the peripheral circuit region, like the interlayer insulating film II1 of the transistor part in the pixel region.

The structure of this embodiment is substantially the same as that of the first embodiment shown in FIG. 3 in other points. The same elements are designated by the same reference numerals, and thus a description thereof will not be repeated.

Next, a manufacturing method of the semiconductor device for an image sensor in this embodiment, specifically, a manufacturing method of the field oxide film shown in FIG. 30, will be described with reference to FIGS. 32 and 33.

Figure 32:
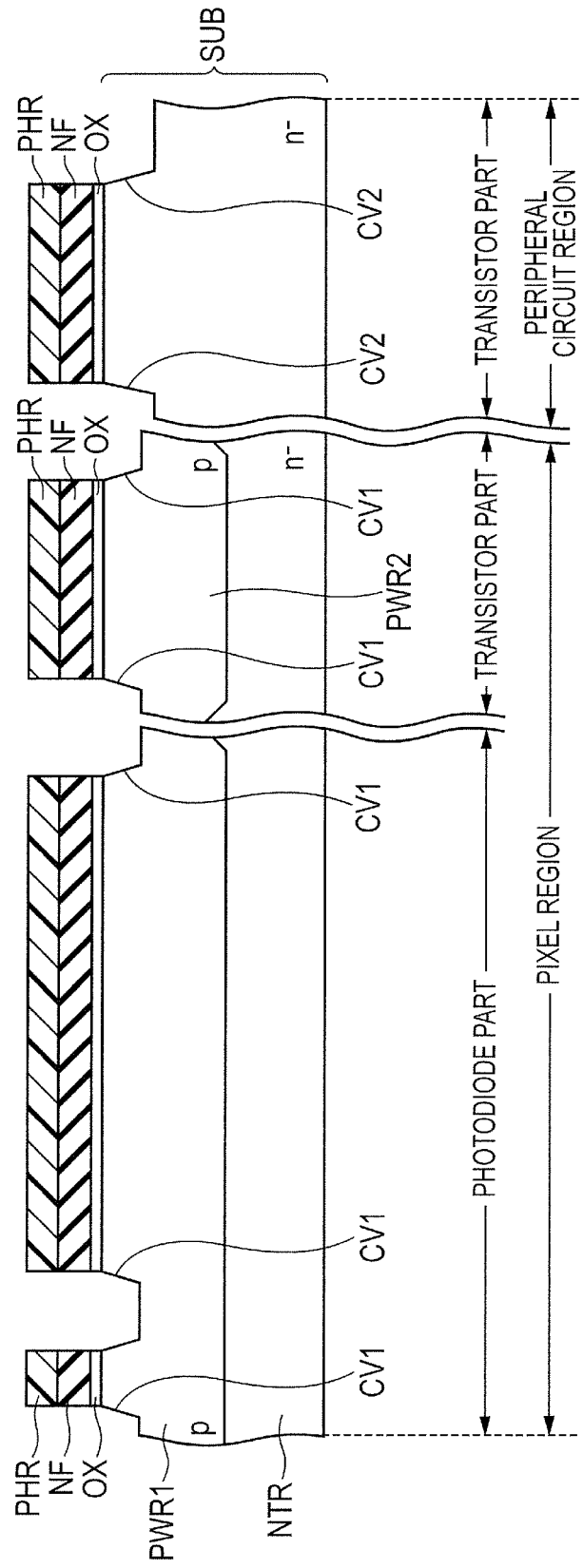
FIG. 32 is a schematic cross-sectional view showing a first step of the manufacturing method of the semiconductor device in the third embodiment.

Referring to FIG. 32, the pixel region is subjected to the same processes as those of steps shown in FIGS. 6 and 7 in the first embodiment to thereby form the concave portion CV1 for forming the field oxide film FO1. In contrast, in the peripheral circuit region, the concave portion CV2 for forming the field oxide film FO2 is formed.

The concave portion CV2 is formed more deeply than the concave portion CV1. For this reason, the etching for forming the concave portion CV2 is preferably performed at different timing from the etching for forming the concave portion CV1. Specifically, in the etching for forming the concave portion CV2, the entire surface of the semiconductor substrate SUB in the pixel region is covered with the pattern of the photoresist, and only the region where the field oxide film FO2 in the peripheral circuit region is to be formed is preferably etched more deeply than that for forming the field oxide film FO1 in the pixel region.

Figure 33:
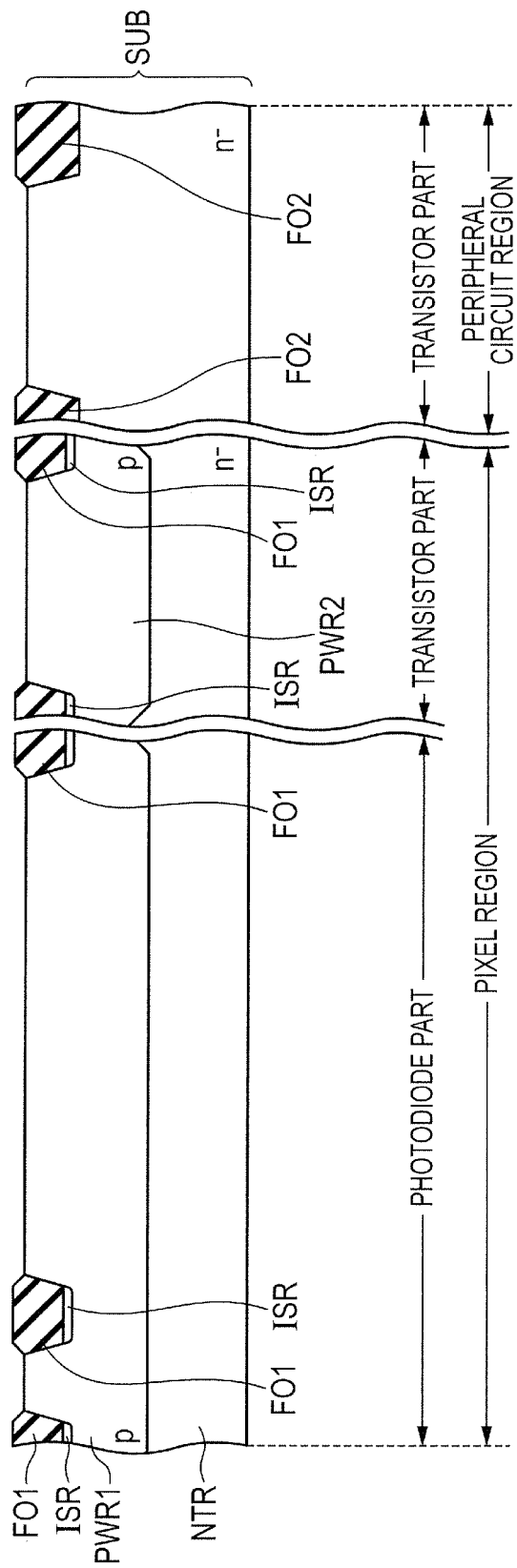
FIG. 33 is a schematic cross-sectional view showing a second step of the manufacturing method of the semiconductor device in the third embodiment.

Referring to FIG. 33, the pixel region is subjected to the same processes as those of steps shown in FIGS. 8 and 9 of the first embodiment, whereby the field oxide film FO1 is formed by the thermal oxidation performed on the bottom side wall of the concave portion CV1, and the p-type isolation region ISR is formed by the normal ion implantation performed on the region directly under the field oxide film FO1. In contrast, in the peripheral circuit region, the field oxide film FO2 is formed over the main surface of the semiconductor substrate SUB by the thermal oxidation performed on the bottom side wall of the concave portion CV2. The p-type isolation region ISR in contact with the bottom surface of the field oxide film FO2, which can be formed by the normal ion implantation, may not necessarily be formed. The concave portion CV2 for forming the field oxide film FO2 is formed more deeply than the concave portion CV1 for forming the field oxide film FO1. As a result, the field oxide film FO2 is formed as the LOCOS oxide film by the thermal oxidation of the bottom side wall of the concave portion CV2 more deeply than the field oxide film FO1 formed as the LOCOS oxide film by the thermal oxidation of the bottom side wall of the concave portion CV1.

Note that the thermal oxidation using the LOCOS method for forming the field oxide film FO2 is preferably performed at different timing from the thermal oxidation using the LOCOS method for forming the field oxide film FO1. Specifically, in the thermal oxidation for forming the field oxide film FO2, the entire surface of the semiconductor substrate SUB in the pixel region is covered with the pattern of the photoresist, and only the bottom side wall of the concave portion CV2 in the peripheral circuit region is preferably subjected to the thermal oxidation under conditions that form the thick LOCOS oxide film in a long time, as compared to the thermal oxidation of the bottom side wall of the concave portion CV1 in the pixel region.

In each of the steps shown in FIGS. 32 and 33, the same process seems to be performed at the same time in the pixel region and the peripheral circuit region for better understanding the flow of the processes. However, actually, the same process is preferably performed in the pixel region and the peripheral circuit region at different timings.

Thus, the order of the processes is not limited to that illustrated in the figures.

In the following steps, the same processes as those in steps shown in FIGS. 10 to 22 of the first embodiment are applied to both the pixel region and the peripheral circuit region, whereby the transistor TR for control is formed in the semiconductor substrate SUB within the peripheral circuit region to be surrounded by the field oxide film FO2, thereby producing the image sensor shown in FIG. 31.

Next, the operation and effects of the preferred embodiment of the invention will be described. As mentioned above, the field oxide films FO1 and FO2 have a damage layer formed therein as not intended when being formed. Via the damage layer, the leak current can be generated to assist in generation of the pixel defects DFT (see FIG. 24). As the field oxide film becomes deeper, the amount of etching for forming the field oxide film is increased, so that the damage layer is more likely to be generated as the field oxide film is formed more deeply. From this point of view, preferably, the field oxide film FO1 is appropriately formed thinly, especially, in the pixel region that significantly affects the characteristics of the pixel.

As the depth of the field oxide film FO1 is increased, the area of an interface between the field oxide film FO1 and the silicon included in the semiconductor substrate SUB around the field oxide film is increased, which can increase noise in the chip region IMC due to the so-called 1/f noise. Thus, the field oxide film FO1 in the pixel region is preferably formed relatively shallowly, and not excessively deeply.

On the other hand, in the peripheral circuit region, a semiconductor element to which a relatively high voltage needs to be applied is formed in some cases. If the shallow field oxide film FO2 is formed near the region where such a semiconductor element is formed, the effect of electric isolation between the elements is so weak that a faulty breakdown voltage for the element isolation can occur. That is, there is a tradeoff between the depth of the field oxide film FO1 in the pixel region and the depth of the field oxide film FO2 in the peripheral circuit region.

Like this embodiment, the field oxide film FO2 in the peripheral circuit region is formed more deeply than the field oxide film FO1 in the pixel region, which reduces the possibility of occurrence of the leak current and noise in the pixel region, as well as the faulty breakdown voltage in the peripheral circuit region. Accordingly, the semiconductor device for the image sensor with high reliability can be provided.

Fourth Embodiment

Figure 34:
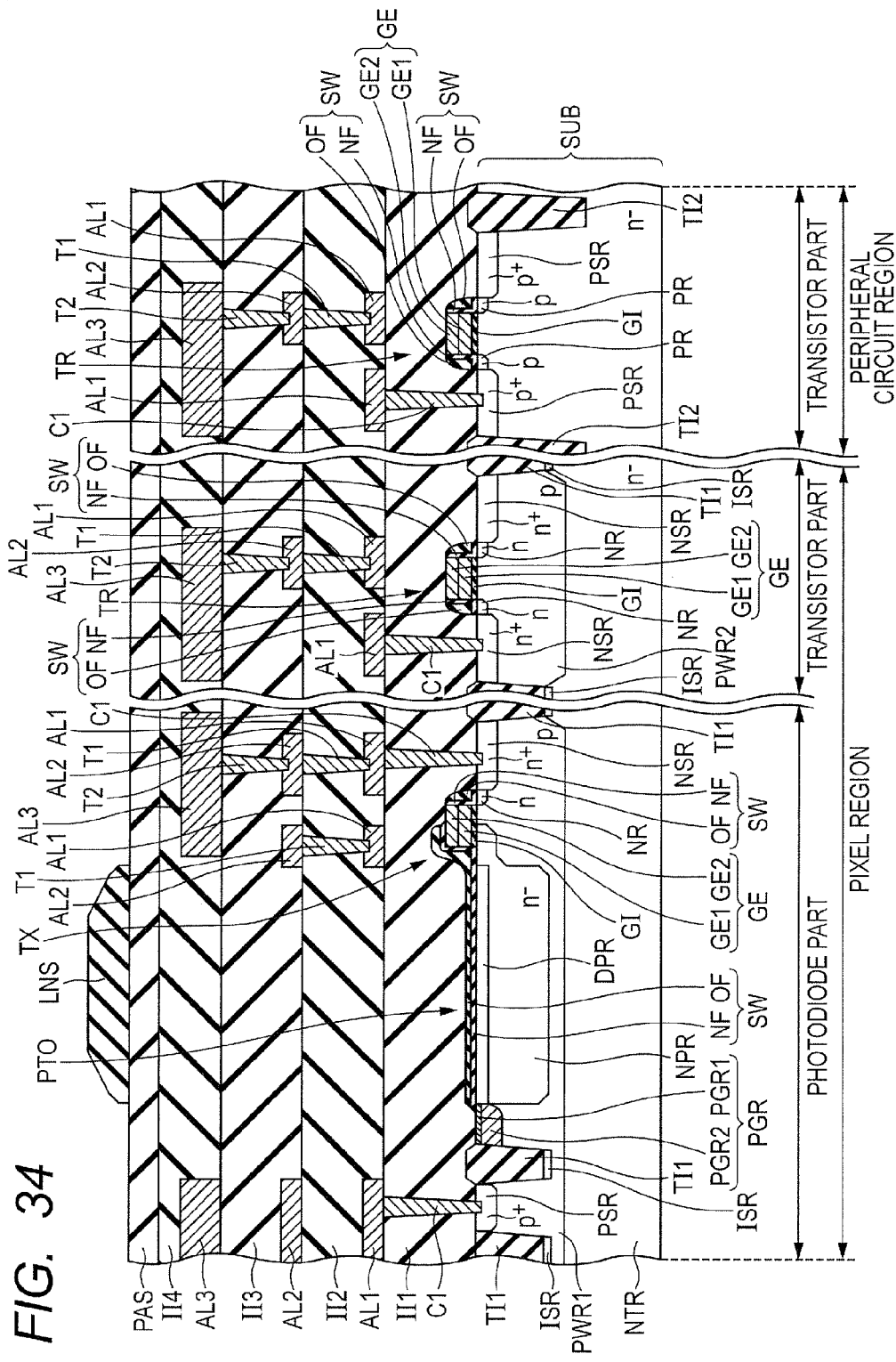
FIG. 34 is a schematic cross-sectional view showing an example of the structure of a semiconductor device according to a fourth embodiment of the invention.

Referring to FIG. 34, the image sensor of this embodiment differs from the image sensor of the third embodiment shown in FIG. 31 in that STI oxide films TI1 and TI2 are formed instead of the field oxide films FO1 and FO2 of the image sensor of the third embodiment shown in FIG. 31. The STI oxide film TI2 is a STI oxide film made of a silicon oxide film which is the same as the STI oxide film TI1. The STI oxide film TI2 as the second isolation insulating film in the peripheral circuit region is formed more deeply than the STI oxide film TI1 as the first isolation insulating film in the pixel region.

The structure of this embodiment is substantially the same as that of the third embodiment shown in FIG. 31 in other points. The same elements are designated by the same reference numerals, and thus a description thereof will not be repeated.

Figure 35:
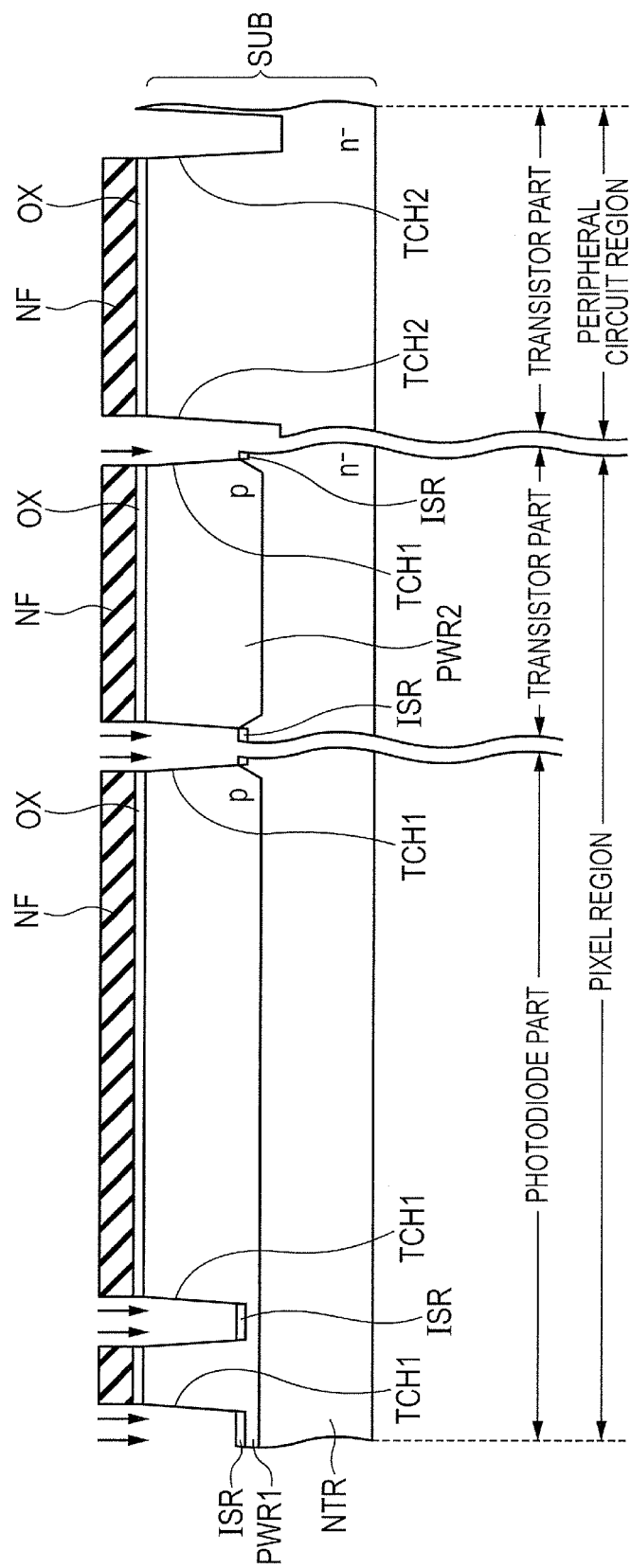
FIG. 35 is a schematic cross-sectional view showing a first step of the manufacturing method of the semiconductor device in the fourth embodiment.

Referring to FIG. 35, the pixel region is subjected to the same process as that of step shown in FIG. 27 of the second embodiment to thereby form the trench TCH1 for forming the STI oxide film TI1. In contrast, in the peripheral circuit region, the trench portion TCH2 for forming the STI oxide film TI2 is formed. The trench portion TCH2 is formed more deeply than the trench portion TCH1. For this reason, preferably, the etching of both the trench portions are carried out at different timings, and the trench portions TCH1 and TCH2 are formed by individually adjusting the depths of these trench portions.

Figure 36:
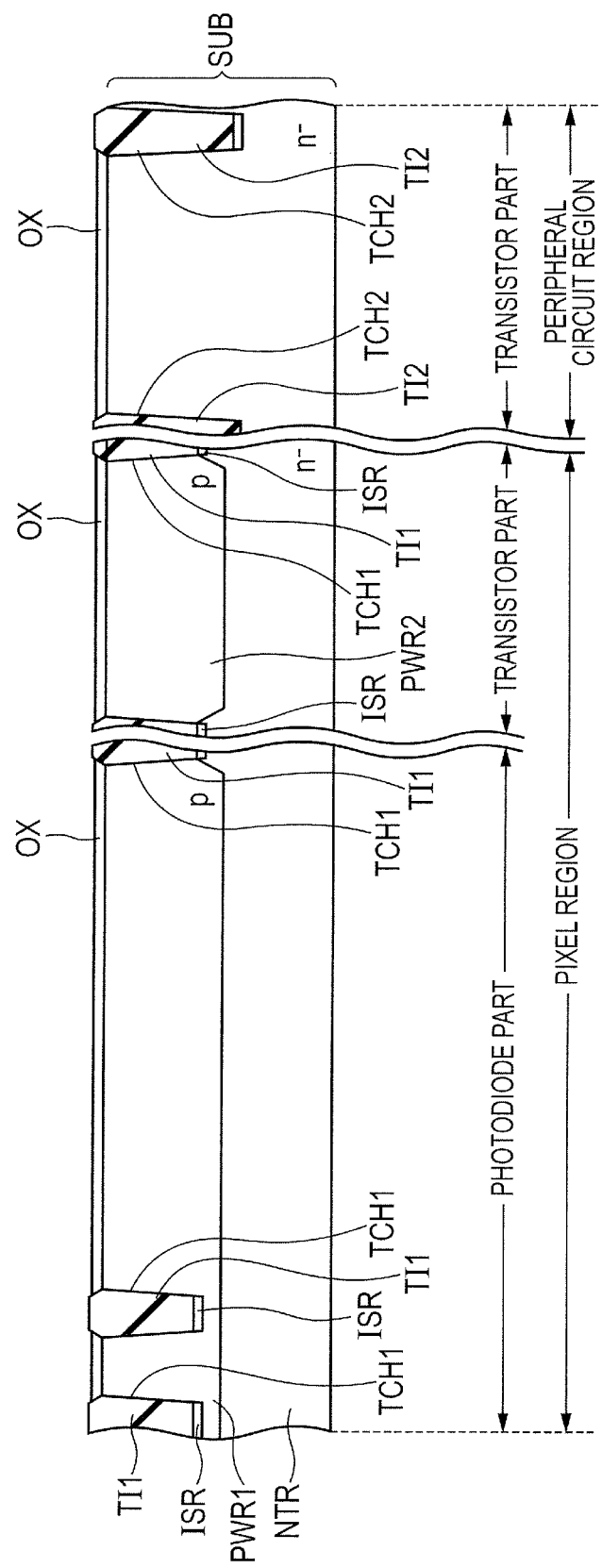
FIG. 36 is a schematic cross-sectional view showing a second step of the manufacturing method of the semiconductor device in the fourth embodiment.

Referring to FIG. 36, the silicon oxide film is deposited as an insulating film in each trench TCH1 of the pixel region in the same way as that of steps shown in FIGS. 28 to 30 of the second embodiment, and polished by the CMP to form the STI oxide film TI1. At the same time, the same processes as described above are performed on each trench TCH2 of the peripheral circuit region. Thus, the silicon oxide film is deposited in the trench TCH2, and polished or the like by the CMP to thereby form the STI oxide film TI2 that is deeper than the STI oxide film TI1.

Like this embodiment, the STI oxide films TI1 and TI2 have the depth thereof controlled in the same way as the field oxide films FO1 and FO2 in the third embodiment. Thus, this embodiment can obtain the same operation and effects as those of the third embodiment.

Although in the above respective embodiments, the guard ring PGR is comprised of the defect extension preventing layer PGR1 and the impurity diffusion layer PGR2, for example, the structure having only the defect extension preventing layer PGR1 at the main surface of the semiconductor substrate SUB without forming the impurity diffusion layer PGR2 is also considered to belong to the one embodiment. Also in this case, this embodiment suppress the extension of defects extending from the damage layer generated when forming the field oxide film FO1 and STI oxide film TI1 adjacent to the guard ring PGR, and thus can ensure the reliability of the pixel.

Although the present invention made by the inventors have been specifically described based on the embodiments, it is obvious that the invention is not limited to the embodiments described above, and that various modifications and changes can be made to those embodiments without departing from the scope of the invention.

What is claimed is:
1. A semiconductor device, comprising:
a semiconductor substrate having a main surface;
a photoelectric conversion element formed in the semiconductor substrate;
a first isolation insulating film formed around the photoelectric conversion element over the main surface;
a current blocking region formed in a region between the photoelectric conversion element and the first isolation insulating film over the main surface and in contact with the first isolation insulating film; and an interlayer insulating film over the main surface so as to cover the photoelectric conversion element and the current blocking region, wherein the current blocking region includes a defect extension preventing layer and an impurity diffusion layer, wherein the defect extension preventing layer is at an upper part of the current blocking region in contact with the interlayer insulating film and is a region with a neutral polarity with at least one element selected from the group comprised of nitrogen, silicon, germanium, fluorine, and argon implanted therein, wherein the impurity diffusion layer is at a lower part of the current blocking region and is a region with a p-type polarity with boron implanted therein, wherein the defect extension preventing layer has a different crystal structure from the impurity diffusion layer, and wherein the impurity diffusion layer and the defect extension preventing layer are in contact with each other so as to form a twin.

2. The semiconductor device according to claim 1,
wherein the first isolation insulating film is a LOCOS oxide film that has a shape expanding toward an upper side and a lower side of the main surface.

3. The semiconductor device according to claim 1,
wherein the first isolation insulating film is an STI oxide film made of an insulating film that fills a trench formed from the main surface in the semiconductor substrate.

4. The semiconductor device according to claim 1,
wherein the defect extension preventing layer is formed from the main surface to a region in a depth of 40 nm or more in a direction vertical to the main surface.

5. The semiconductor device according to claim 1,
wherein a diffusion region for isolation is disposed in contact with a bottom surface of the first isolation insulating film.

6. The semiconductor device according to claim 1,
wherein the main surface includes a pixel region and a peripheral circuit region, wherein the photoelectric conversion element, the current blocking region, and the first isolation insulating film are formed in the pixel region, wherein the semiconductor device further comprises:

a semiconductor element formed in the semiconductor substrate in the peripheral circuit region; and a second isolation insulating film around the semiconductor element over the main surface in the peripheral circuit region, and wherein the second isolation insulating film is formed more deeply than the first isolation insulating film.

7. The semiconductor device according to claim 6,
wherein each of the first and second isolation insulating films is a LOCOS that has a shape expanding toward an upper side and a lower side of the main surface.

8. The semiconductor device according to claim 6,
wherein each of the first and second isolation insulating films is an STI made of an insulating film that fills a trench formed from the main surface in the semiconductor substrate.

* * * * *